United States Patent
Duong et al.

(10) Patent No.: US 7,829,358 B2
(45) Date of Patent: Nov. 9, 2010

(54) SYSTEM AND METHOD FOR EMITTER LAYER SHAPING

(75) Inventors: Dung T. Duong, Cedar Park, TX (US); Paul N. Winberg, Rollingwood, TX (US); Matthew R. Thomas, Austin, TX (US); Elliot M. Pickering, Austin, TX (US); Muhammad Khizar, Charlotte, NC (US)

(73) Assignee: Illumitex, Inc., Austin, TX (US)

( * ) Notice: Subject to any disclaimer, the term of this patent is extended or adjusted under 35 U.S.C. 154(b) by 0 days.

(21) Appl. No.: 12/367,343

(22) Filed: Feb. 6, 2009

(65) Prior Publication Data
US 2009/0289263 A1    Nov. 26, 2009

Related U.S. Application Data

(60) Provisional application No. 61/027,354, filed on Feb. 8, 2008, provisional application No. 61/049,964, filed on May 2, 2008.

(51) Int. Cl.
*H01L 21/00* (2006.01)

(52) U.S. Cl. ............ 438/20; 257/E21.05; 257/E21.379; 257/E21.381

(58) Field of Classification Search ................ 438/20, 438/317, 338, 342, 345; 257/13, 79, 164, 257/E21.05, E21.379, E21.381
See application file for complete search history.

(56) References Cited

U.S. PATENT DOCUMENTS

| | | | |
|---|---|---|---|
| 1,670,837 A | 5/1828 | Blackmore | |
| 3,981,023 A | 9/1976 | King | |
| 3,988,633 A | 10/1976 | Shurgan et al. | |
| 4,125,890 A | 11/1978 | Nixon, Jr. | |
| 4,180,755 A | 12/1979 | Nixon, Jr. | |
| 4,239,369 A | 12/1980 | English et al. | |
| 4,304,479 A | 12/1981 | Van Allen | |

(Continued)

FOREIGN PATENT DOCUMENTS

CN    101385145 A    3/2009

(Continued)

OTHER PUBLICATIONS

International Search Report and Written Opinion, PCT/US09/051962, mailed Sep. 15, 2009, 5 pgs.

(Continued)

*Primary Examiner*—Quoc D Hoang
(74) *Attorney, Agent, or Firm*—Sprinkle IP Law Group

(57) ABSTRACT

Embodiments of an LED disclosed has an emitter layer shaped to a controlled depth or height relative to a substrate of the LED to maximize the light output of the LED and to achieve a desired intensity distribution. In some embodiments, the exit face of the LED may be selected to conserve radiance. In some embodiments, shaping the entire LED, including the substrate and sidewalls, or shaping the substrate alone can extract 100% or approximately 100% of the light generated at the emitter layers from the emitter layers. In some embodiments, the total efficiency is at least 90% or above. In some embodiments, the emitter layer can be shaped by etching, mechanical shaping, or a combination of various shaping methods. In some embodiments, only a portion of the emitter layer is shaped to form the tiny emitters. The unshaped portion forms a continuous electrical connection for the LED.

18 Claims, 14 Drawing Sheets

U.S. PATENT DOCUMENTS

| | | | |
|---|---|---|---|
| 4,388,633 A | 6/1983 | Vasudev |
| 4,439,910 A | 4/1984 | Vasudev |
| 4,486,364 A | 12/1984 | Takahashi |
| 4,501,637 A | 2/1985 | Mitchell et al. |
| 4,716,507 A | 12/1987 | Ames |
| 4,728,999 A | 3/1988 | Dannatt et al. |
| 4,740,259 A | 4/1988 | Heinen |
| 4,799,136 A | 1/1989 | Molnar |
| 4,841,344 A | 6/1989 | Heinen |
| 4,966,862 A | 10/1990 | Edmond |
| 5,036,339 A | 7/1991 | Hediger |
| 5,087,949 A | 2/1992 | Haitz |
| 5,114,513 A | 5/1992 | Hosokawa |
| 5,126,929 A | 6/1992 | Cheselke |
| 5,151,718 A | 9/1992 | Nelson |
| 5,174,649 A | 12/1992 | Alston |
| 5,218,216 A | 6/1993 | Manabe et al. |
| 5,233,204 A | 8/1993 | Fletcher et al. |
| 5,251,117 A | 10/1993 | Nagai |
| 5,272,108 A | 12/1993 | Kozawa et al. |
| 5,278,433 A | 1/1994 | Manabe et al. |
| 5,281,830 A | 1/1994 | Kotaki et al. |
| 5,315,490 A | 5/1994 | Bastable |
| 5,369,289 A | 11/1994 | Tamaki et al. |
| 5,523,591 A | 6/1996 | Fleming et al. |
| 5,528,720 A | 6/1996 | Winston |
| 5,563,422 A | 10/1996 | Nakamura et al. |
| 5,578,156 A | 11/1996 | Kamakura et al. |
| 5,587,593 A | 12/1996 | Koide et al. |
| 5,620,557 A | 4/1997 | Manabe et al. |
| 5,652,438 A | 7/1997 | Sassa et al. |
| 5,654,831 A | 8/1997 | Byren et al. |
| 5,667,297 A | 9/1997 | Maassen |
| 5,700,713 A | 12/1997 | Yamazaki et al. |
| 5,739,554 A | 4/1998 | Edmond et al. |
| 5,780,867 A | 7/1998 | Fritz et al. |
| 5,790,583 A | 8/1998 | Ho |
| 5,813,753 A | 9/1998 | Vriens et al. |
| 5,839,424 A | 11/1998 | Hauser |
| 5,846,844 A | 12/1998 | Akasaki et al. |
| 5,862,167 A | 1/1999 | Sassa et al. |
| 5,912,477 A | 6/1999 | Negley |
| 5,945,689 A | 8/1999 | Koike et al. |
| 5,953,469 A | 9/1999 | Zhou |
| 5,959,401 A | 9/1999 | Asami et al. |
| 5,998,925 A | 12/1999 | Shimizu et al. |
| 6,005,722 A | 12/1999 | Butterworth et al. |
| 6,008,539 A | 12/1999 | Shibata et al. |
| 6,023,076 A | 2/2000 | Shibata |
| 6,066,861 A | 5/2000 | Hohn et al. |
| 6,078,064 A | 6/2000 | Ming-Jiunn et al. |
| 6,093,941 A | 7/2000 | Russell |
| 6,118,908 A | 9/2000 | Bischel |
| 6,133,589 A | 10/2000 | Krames |
| 6,144,536 A | 11/2000 | Zimmerman |
| 6,169,294 B1 | 1/2001 | Biing-Jye et al. |
| 6,177,761 B1 | 1/2001 | Pelka et al. |
| 6,185,051 B1 | 2/2001 | Chen et al. |
| 6,194,742 B1 | 2/2001 | Kern et al. |
| 6,201,262 B1 | 3/2001 | Edmond et al. |
| 6,221,683 B1 | 4/2001 | Nirsche et al. |
| 6,222,207 B1 | 4/2001 | Carter-Coman et al. |
| 6,229,160 B1 | 5/2001 | Krames |
| 6,229,782 B1 | 5/2001 | Wang et al. |
| 6,257,737 B1 | 7/2001 | Marshall et al. |
| 6,258,618 B1 | 7/2001 | Lester |
| 6,271,622 B1 | 8/2001 | Coushaine et al. |
| 6,274,924 B1 | 8/2001 | Carey et al. |
| 6,287,947 B1 | 9/2001 | Ludowise et al. |
| 6,307,218 B1 | 10/2001 | Steigerwald et al. |
| 6,310,364 B1 | 10/2001 | Uemura |
| 6,323,063 B2 | 11/2001 | Krames |
| 6,331,450 B1 | 12/2001 | Uemura |
| 6,335,999 B1 | 1/2002 | Winston |
| 6,337,493 B1 | 1/2002 | Tanizawa et al. |
| D453,745 S | 2/2002 | Suenaga |
| 6,350,041 B1 | 2/2002 | Tarsa et al. |
| 6,351,069 B1 | 2/2002 | Lowery et al. |
| 6,356,700 B1 | 3/2002 | Strobl |
| 6,361,192 B1 | 3/2002 | Fussell et al. |
| 6,364,487 B1 | 4/2002 | Weber et al. |
| 6,377,535 B1 | 4/2002 | Chen et al. |
| 6,410,942 B1 | 6/2002 | Thibeault |
| 6,417,019 B1 | 7/2002 | Mueller et al. |
| 6,443,594 B1 | 9/2002 | Marshall et al. |
| 6,445,011 B1 | 9/2002 | Hirano et al. |
| 6,452,214 B2 | 9/2002 | Kaneyama et al. |
| 6,459,100 B1 | 10/2002 | Doverspike et al. |
| 6,478,453 B2 | 11/2002 | Lammers et al. |
| 6,486,499 B1 | 11/2002 | Krames et al. |
| 6,489,636 B1 | 12/2002 | Goetz et al. |
| 6,501,102 B2 | 12/2002 | Mueller-Mach et al. |
| 6,502,956 B1 | 1/2003 | Wu |
| 6,504,171 B1 | 1/2003 | Grillot et al. |
| 6,504,179 B1 | 1/2003 | Ellens et al. |
| 6,514,782 B1 | 2/2003 | Wierer, Jr. et al. |
| 6,515,313 B1 | 2/2003 | Ibbetson et al. |
| 6,526,082 B1 | 2/2003 | Corzine et al. |
| 6,526,201 B1 | 2/2003 | Mrakovich et al. |
| 6,534,797 B1 | 3/2003 | Edmond et al. |
| 6,541,800 B2 | 4/2003 | Barnett et al. |
| 6,547,416 B2 | 4/2003 | Pashley et al. |
| 6,547,423 B2 | 4/2003 | Marshall |
| 6,563,142 B2 | 5/2003 | Shen et al. |
| 6,570,190 B2 | 5/2003 | Krames |
| 6,573,537 B1 | 6/2003 | Steigerwald et al. |
| 6,576,488 B2 | 6/2003 | Collins, III et al. |
| 6,576,932 B2 | 6/2003 | Khare et al. |
| D477,579 S | 7/2003 | Suenaga |
| D477,580 S | 7/2003 | Kamada |
| 6,598,998 B2 | 7/2003 | West |
| D478,877 S | 8/2003 | Hoshiba |
| 6,603,243 B2 | 8/2003 | Parkyn et al. |
| 6,603,258 B1 | 8/2003 | Mueller-Mach et al. |
| 6,608,330 B1 | 8/2003 | Yamada |
| 6,610,598 B2 | 8/2003 | Chen |
| 6,620,643 B1 | 9/2003 | Koike et al. |
| 6,623,142 B1 | 9/2003 | Lippmann et al. |
| 6,630,689 B2 | 10/2003 | Bhat et al. |
| 6,630,691 B1 | 10/2003 | Mueller-Mach et al. |
| 6,630,692 B2 | 10/2003 | Goetz et al. |
| 6,635,503 B2 | 10/2003 | Andrews et al. |
| 6,635,904 B2 | 10/2003 | Goetz et al. |
| 6,637,921 B2 | 10/2003 | Coushaine |
| 6,639,733 B2 | 10/2003 | Minano |
| D482,337 S | 11/2003 | Kamada |
| D482,666 S | 11/2003 | Kamada |
| 6,642,618 B2 | 11/2003 | Yagi et al. |
| 6,642,652 B2 | 11/2003 | Collins, III et al. |
| 6,649,440 B1 | 11/2003 | Krames et al. |
| 6,649,943 B2 | 11/2003 | Shibata et al. |
| 6,649,946 B2 | 11/2003 | Bogner et al. |
| 6,650,044 B1 | 11/2003 | Lowery |
| 6,657,236 B1 | 12/2003 | Thibeault |
| 6,657,300 B2 | 12/2003 | Goetz et al. |
| 6,664,560 B2 | 12/2003 | Emerson et al. |
| 6,671,452 B2 | 12/2003 | Winston |
| 6,679,621 B2 | 1/2004 | West et al. |
| 6,680,490 B2 | 1/2004 | Yasukawa et al. |
| 6,680,569 B2 | 1/2004 | Mueller-Mach et al. |
| 6,682,207 B2 | 1/2004 | Weber et al. |
| 6,682,331 B1 | 1/2004 | Peh |
| 6,683,327 B2 | 1/2004 | Krames et al. |
| 6,686,691 B1 | 2/2004 | Mueller et al. |

| Patent | Type | Date | Inventor |
|---|---|---|---|
| 6,696,703 | B2 | 2/2004 | Mueller-Mach et al. |
| 6,711,200 | B1 | 3/2004 | Scherer |
| 6,717,353 | B1 | 4/2004 | Mueller et al. |
| 6,717,355 | B2 | 4/2004 | Takahashi et al. |
| D489,690 | S | 5/2004 | Ishida |
| D490,387 | S | 5/2004 | Yagi |
| 6,730,939 | B2 | 5/2004 | Eisert et al. |
| 6,730,940 | B1 | 5/2004 | Steranka |
| 6,734,467 | B2 | 5/2004 | Schlereth et al. |
| 6,737,681 | B2 | 5/2004 | Koda |
| 6,738,175 | B2 | 5/2004 | Morita et al. |
| 6,740,906 | B2 | 5/2004 | Slater, Jr. et al. |
| 6,746,124 | B2 | 5/2004 | Fischer et al. |
| D490,782 | S | 6/2004 | Suenaga |
| D490,784 | S | 6/2004 | Ishida |
| D491,538 | S | 6/2004 | Ishida |
| D491,899 | S | 6/2004 | Yagi |
| 6,744,071 | B2 | 6/2004 | Sano et al. |
| 6,744,077 | B2 | 6/2004 | Trottier et al. |
| 6,746,295 | B2 | 6/2004 | Sorg |
| 6,747,298 | B2 | 6/2004 | Slater, Jr. et al. |
| 6,759,803 | B2 | 7/2004 | Sorg |
| 6,764,932 | B2 | 7/2004 | Kong et al. |
| 6,768,136 | B2 | 7/2004 | Eisert et al. |
| 6,768,525 | B2 | 7/2004 | Paolini |
| 6,774,405 | B2 | 8/2004 | Yasukawa et al. |
| 6,777,871 | B2 | 8/2004 | Duggal |
| 6,784,027 | B2 | 8/2004 | Struebel et al. |
| D495,822 | S | 9/2004 | Yoneda |
| D496,007 | S | 9/2004 | Hoshiba |
| 6,791,103 | B2 | 9/2004 | Nakamura et al. |
| 6,791,116 | B2 | 9/2004 | Takahashi et al. |
| 6,791,119 | B2 | 9/2004 | Slater |
| 6,794,211 | B2 | 9/2004 | Oh |
| 6,794,684 | B2 | 9/2004 | Slater, Jr. et al. |
| 6,794,690 | B2 | 9/2004 | Uemura |
| D497,349 | S | 10/2004 | Hoshiba |
| 6,800,500 | B2 | 10/2004 | Coman |
| 6,800,876 | B2 | 10/2004 | Edmond et al. |
| 6,806,571 | B2 | 10/2004 | Shibata et al. |
| 6,812,053 | B1 | 11/2004 | Kong et al. |
| 6,812,500 | B2 | 11/2004 | Reeh et al. |
| 6,814,470 | B2 | 11/2004 | Rizkin et al. |
| 6,819,505 | B1 | 11/2004 | Cassarly |
| 6,819,506 | B1 | 11/2004 | Taylor |
| 6,821,804 | B2 | 11/2004 | Thibeault |
| 6,825,501 | B2 | 11/2004 | Edmond et al. |
| D499,384 | S | 12/2004 | Kamada |
| D499,385 | S | 12/2004 | Ishida |
| 6,828,596 | B2 | 12/2004 | Steigerwald et al. |
| 6,828,599 | B2 | 12/2004 | Kim |
| 6,831,302 | B2 | 12/2004 | Erchak |
| 6,831,305 | B2 | 12/2004 | Yasukawa et al. |
| 6,833,564 | B2 | 12/2004 | Shen et al. |
| 6,835,957 | B2 | 12/2004 | Stockman |
| 6,838,705 | B1 | 1/2005 | Tanizawa et al. |
| 6,841,931 | B2 | 1/2005 | Takahashi et al. |
| 6,844,565 | B2 | 1/2005 | Lell et al. |
| 6,844,903 | B2 | 1/2005 | Mueller-Mach et al. |
| 6,846,101 | B2 | 1/2005 | Coushaine |
| 6,847,057 | B1 | 1/2005 | Gardner et al. |
| 6,850,002 | B2 | 2/2005 | Danielson et al. |
| 6,853,010 | B2 | 2/2005 | Slater |
| D502,449 | S | 3/2005 | Ishida |
| D503,388 | S | 3/2005 | Ishida |
| 6,870,191 | B2 | 3/2005 | Niki et al. |
| 6,870,311 | B2 | 3/2005 | Mueller et al. |
| 6,871,982 | B2 | 3/2005 | Holman |
| 6,872,986 | B2 | 3/2005 | Fukuda et al. |
| 6,876,008 | B2 | 4/2005 | Bhat et al. |
| 6,877,009 | B2 | 4/2005 | Narukawa et al. |
| 6,877,558 | B2 | 4/2005 | Connell et al. |
| 6,878,973 | B2 | 4/2005 | Lowery et al. |
| 6,885,033 | B2 | 4/2005 | Andrews |
| 6,885,036 | B2 | 4/2005 | Tarsa |
| 6,888,997 | B2 | 5/2005 | Duong |
| 6,890,085 | B2 | 5/2005 | Hacker |
| 6,891,199 | B2 | 5/2005 | Baur et al. |
| 6,896,381 | B2 | 5/2005 | Benitez |
| 6,897,488 | B2 | 5/2005 | Baur et al. |
| 6,897,490 | B2 | 5/2005 | Brunner et al. |
| 6,900,472 | B2 | 5/2005 | Kondoh et al. |
| 6,900,474 | B2 | 5/2005 | Misra et al. |
| D506,449 | S | 6/2005 | Hoshiba |
| 6,903,376 | B2 | 6/2005 | Shen et al. |
| 6,906,352 | B2 | 6/2005 | Edmond et al. |
| 6,911,676 | B2 | 6/2005 | Yoo |
| 6,916,748 | B2 * | 7/2005 | Huang ........................ 438/710 |
| 6,917,059 | B2 | 7/2005 | Uemura |
| 6,921,928 | B2 | 7/2005 | Sonobe |
| 6,924,514 | B2 | 8/2005 | Suenaga |
| 6,924,596 | B2 | 8/2005 | Sato et al. |
| 6,925,100 | B2 | 8/2005 | Senda et al. |
| 6,936,859 | B1 | 8/2005 | Uemura et al. |
| 6,936,860 | B2 | 8/2005 | Sung et al. |
| 6,943,128 | B2 | 9/2005 | Chiyo et al. |
| 6,943,380 | B2 | 9/2005 | Ota et al. |
| 6,943,381 | B2 | 9/2005 | Gardner et al. |
| 6,943,433 | B2 | 9/2005 | Kamada |
| 6,946,682 | B2 | 9/2005 | Slater, Jr. et al. |
| 6,946,685 | B1 | 9/2005 | Steigerwald et al. |
| D510,913 | S | 10/2005 | Sumitani |
| 6,952,024 | B2 | 10/2005 | Edmond et al. |
| 6,953,952 | B2 | 10/2005 | Asakawa |
| 6,955,933 | B2 | 10/2005 | Bour et al. |
| 6,956,245 | B2 | 10/2005 | Senda et al. |
| 6,956,247 | B1 | 10/2005 | Stockman |
| 6,958,497 | B2 | 10/2005 | Emerson et al. |
| 6,960,878 | B2 | 11/2005 | Sakano et al. |
| 6,967,116 | B2 | 11/2005 | Negley |
| 6,969,946 | B2 | 11/2005 | Steranka |
| 6,972,438 | B2 | 12/2005 | Li |
| 6,977,396 | B2 | 12/2005 | Shen et al. |
| 6,987,281 | B2 | 1/2006 | Edmond et al. |
| 6,987,287 | B2 | 1/2006 | Liu et al. |
| 6,987,613 | B2 | 1/2006 | Pocius |
| 6,989,555 | B2 | 1/2006 | Goetz et al. |
| 6,992,334 | B1 | 1/2006 | Wierer, Jr. et al. |
| 6,993,242 | B2 | 1/2006 | Winston |
| 6,995,032 | B2 | 2/2006 | Bruhns et al. |
| 6,998,771 | B2 | 2/2006 | Debray et al. |
| 7,001,058 | B2 | 2/2006 | Inditsky |
| 7,002,291 | B2 | 2/2006 | Ellens et al. |
| 7,005,679 | B2 | 2/2006 | Tarsa et al. |
| 7,005,681 | B2 | 2/2006 | Bader et al. |
| 7,005,684 | B2 | 2/2006 | Uemura et al. |
| 7,009,008 | B1 | 3/2006 | Hohn et al. |
| 7,009,199 | B2 | 3/2006 | Hall |
| 7,009,213 | B2 | 3/2006 | Camras |
| 7,009,218 | B2 | 3/2006 | Sugimoto et al. |
| 7,012,279 | B2 | 3/2006 | Wierer, Jr. et al. |
| 7,012,281 | B2 | 3/2006 | Tsai et al. |
| 7,015,054 | B2 | 3/2006 | Steigerwald et al. |
| 7,015,513 | B2 | 3/2006 | Hsieh |
| 7,015,516 | B2 | 3/2006 | Eliashevich |
| 7,018,915 | B2 | 3/2006 | Shibata et al. |
| 7,021,797 | B2 | 4/2006 | Minano |
| 7,026,653 | B2 | 4/2006 | Sun |
| 7,029,935 | B2 | 4/2006 | Negley et al. |
| 7,029,939 | B2 | 4/2006 | Chiyo et al. |
| 7,030,423 | B2 | 4/2006 | Chang et al. |
| 7,037,741 | B2 | 5/2006 | Tasi et al. |
| 7,038,246 | B2 | 5/2006 | Uemura |
| 7,038,370 | B2 | 5/2006 | Mueller-Mach et al. |
| 7,040,774 | B2 | 5/2006 | Beeson |
| 7,042,012 | B2 | 5/2006 | Senda et al. |

| | | |
|---|---|---|
| 7,042,153 B2 | 5/2006 | Uemura |
| 7,045,956 B2 | 5/2006 | Braune et al. |
| 7,053,417 B2 | 5/2006 | Kim |
| 7,053,419 B1 | 5/2006 | Camras |
| 7,063,807 B2 | 6/2006 | Kummer et al. |
| 7,064,353 B2 | 6/2006 | Bhat |
| 7,064,355 B2 | 6/2006 | Camras |
| 7,064,480 B2 | 6/2006 | Bokor et al. |
| 7,070,300 B2 | 7/2006 | Harbers et al. |
| 7,071,494 B2 | 7/2006 | Steigerwald |
| 7,071,495 B2 | 7/2006 | Uemura |
| 7,072,096 B2 | 7/2006 | Holman |
| 7,074,631 B2 | 7/2006 | Erchak |
| 7,075,610 B2 | 7/2006 | Scalora |
| 7,078,254 B2 | 7/2006 | Loh |
| 7,078,732 B1 | 7/2006 | Reeh et al. |
| 7,078,738 B1 | 7/2006 | Nawashiro et al. |
| 7,080,932 B2 | 7/2006 | Keuper |
| 7,083,993 B2 | 8/2006 | Erchak |
| 7,087,738 B2 | 8/2006 | Botstein et al. |
| 7,087,931 B2 | 8/2006 | Wu et al. |
| 7,087,936 B2 | 8/2006 | Negley |
| 7,091,656 B2 | 8/2006 | Murazaki et al. |
| 7,095,765 B2 | 8/2006 | Liu et al. |
| 7,098,588 B2 | 8/2006 | Jager et al. |
| 7,105,857 B2 | 9/2006 | Nagahama et al. |
| 7,106,090 B2 | 9/2006 | Harle et al. |
| 7,108,386 B2 | 9/2006 | Jacobson |
| 7,109,521 B2 | 9/2006 | Hallin |
| 7,109,529 B2 | 9/2006 | Uemura et al. |
| 7,111,964 B2 | 9/2006 | Suehiro et al. |
| 7,112,636 B2 | 9/2006 | Okada |
| 7,122,839 B2 | 10/2006 | Shen et al. |
| 7,132,695 B2 | 11/2006 | Ou et al. |
| 7,132,786 B1 | 11/2006 | Debray et al. |
| 7,138,662 B2 | 11/2006 | Uemura |
| 7,153,015 B2 | 12/2006 | Brukilacchio |
| 7,154,121 B2 | 12/2006 | Hsieh et al. |
| 7,154,149 B2 | 12/2006 | Wu et al. |
| D534,505 S | 1/2007 | Kamada |
| 7,157,294 B2 | 1/2007 | Uemura et al. |
| 7,161,187 B2 | 1/2007 | Suehiro et al. |
| 7,161,301 B2 | 1/2007 | Hsieh et al. |
| 7,170,097 B2 | 1/2007 | Edmond et al. |
| D536,672 S | 2/2007 | Asakawa |
| D537,047 S | 2/2007 | Asakawa |
| 7,183,586 B2 | 2/2007 | Ichihara et al. |
| 7,183,632 B2 | 2/2007 | Arndt |
| 7,183,661 B2 | 2/2007 | Bogner et al. |
| 7,192,797 B2 | 3/2007 | Tu et al. |
| 7,193,299 B2 | 3/2007 | Arndt et al. |
| 7,196,359 B2 | 3/2007 | Baur et al. |
| 7,201,495 B2 | 4/2007 | Epstein |
| 7,202,181 B2 | 4/2007 | Negley |
| 7,211,832 B2 | 5/2007 | Hirose |
| 7,211,833 B2 | 5/2007 | Slater, Jr. et al. |
| 7,211,835 B2 | 5/2007 | Ono |
| 7,215,074 B2 | 5/2007 | Shimizu et al. |
| 7,217,583 B2 | 5/2007 | Negley et al. |
| 7,227,190 B2 | 6/2007 | Yasukawa et al. |
| 7,227,191 B2 | 6/2007 | Eberhard et al. |
| D547,736 S | 7/2007 | Kamada |
| 7,244,968 B2 | 7/2007 | Yoo |
| 7,247,257 B2 | 7/2007 | Murazaki et al. |
| 7,247,884 B2 | 7/2007 | Shibata et al. |
| 7,247,940 B2 | 7/2007 | Hofer et al. |
| 7,250,715 B2 | 7/2007 | Mueller et al. |
| 7,253,450 B2 | 8/2007 | Senda et al. |
| 7,253,451 B2 | 8/2007 | Yoo et al. |
| 7,256,428 B2 | 8/2007 | Braune et al. |
| 7,256,468 B2 | 8/2007 | Suenaga |
| 7,256,483 B2 | 8/2007 | Epler et al. |
| 7,258,816 B2 | 8/2007 | Tamaki et al. |
| 7,259,033 B2 | 8/2007 | Slater, Jr. et al. |
| 7,259,402 B2 | 8/2007 | Edmond et al. |
| 7,264,527 B2 | 9/2007 | Bawendi et al. |
| 7,265,392 B2 | 9/2007 | Hahn et al. |
| 7,268,371 B2 | 9/2007 | Krames et al. |
| 7,274,040 B2 | 9/2007 | Sun |
| 7,279,346 B2 | 10/2007 | Andrews et al. |
| 7,279,723 B2 | 10/2007 | Matsumura et al. |
| 7,279,724 B2 | 10/2007 | Collins, III et al. |
| 7,280,288 B2 | 10/2007 | Loh et al. |
| 7,282,744 B2 | 10/2007 | Flynn et al. |
| 7,288,797 B2 | 10/2007 | Deguchi et al. |
| 7,291,529 B2 | 11/2007 | Slater, Jr. et al. |
| 7,291,865 B2 | 11/2007 | Kojima et al. |
| 7,294,866 B2 | 11/2007 | Liu |
| 7,300,175 B2 | 11/2007 | Brukilacchio |
| D557,224 S | 12/2007 | Kamada |
| 7,319,247 B2 | 1/2008 | Bader et al. |
| 7,319,289 B2 | 1/2008 | Suehiro et al. |
| 7,326,583 B2 | 2/2008 | Andrews et al. |
| 7,326,967 B2 | 2/2008 | Hsieh et al. |
| 7,329,587 B2 | 2/2008 | Bruederl et al. |
| 7,329,905 B2 | 2/2008 | Ibbetson et al. |
| 7,332,365 B2 | 2/2008 | Nakamura et al. |
| 7,335,522 B2 | 2/2008 | Wang et al. |
| 7,335,920 B2 | 2/2008 | Denbaars et al. |
| 7,338,822 B2 | 3/2008 | Wu et al. |
| 7,341,878 B2 | 3/2008 | Krames et al. |
| 7,344,902 B2 | 3/2008 | Basin et al. |
| 7,345,297 B2 | 3/2008 | Yamazoe et al. |
| 7,345,313 B2 | 3/2008 | Strauss et al. |
| 7,345,413 B2 | 3/2008 | Braune et al. |
| 7,348,600 B2 | 3/2008 | Narukawa et al. |
| D565,516 S | 4/2008 | Kamada |
| 7,351,356 B2 | 4/2008 | Delsing et al. |
| 7,352,011 B2 | 4/2008 | Smits et al. |
| 7,355,209 B2 | 4/2008 | Tsai et al. |
| 7,355,210 B2 | 4/2008 | Ou et al. |
| 7,355,284 B2 | 4/2008 | Negley |
| 7,358,522 B2 | 4/2008 | Yanamoto |
| 7,358,540 B2 | 4/2008 | Hsieh et al. |
| 7,361,938 B2 | 4/2008 | Mueller et al. |
| 7,362,048 B2 | 4/2008 | Shimizu et al. |
| 7,365,369 B2 | 4/2008 | Nakamura et al. |
| 7,365,371 B2 | 4/2008 | Andrews |
| 7,368,329 B2 | 5/2008 | Waitl et al. |
| 7,372,198 B2 | 5/2008 | Negley |
| 7,375,377 B2 | 5/2008 | Baur et al. |
| D571,738 S | 6/2008 | Wall, Jr. |
| 7,382,033 B2 | 6/2008 | Roth et al. |
| 7,384,809 B2 | 6/2008 | Donofrio |
| 7,385,226 B2 | 6/2008 | Ou et al. |
| 7,387,677 B2 | 6/2008 | Dwilinski et al. |
| 7,388,232 B2 | 6/2008 | Suehiro et al. |
| 7,390,684 B2 | 6/2008 | Izuno et al. |
| D572,209 S | 7/2008 | Tokuda |
| 7,393,122 B2 | 7/2008 | Tsuzuki et al. |
| 7,393,213 B2 | 7/2008 | Yoo et al. |
| 7,402,837 B2 | 7/2008 | Slater, Jr. et al. |
| 7,402,840 B2 | 7/2008 | Krames et al. |
| 7,405,093 B2 | 7/2008 | Andrews |
| 7,414,269 B2 | 8/2008 | Grotsch et al. |
| 7,419,839 B2 | 9/2008 | Camras et al. |
| 7,429,750 B2 | 9/2008 | Suehiro et al. |
| 7,429,758 B2 | 9/2008 | Ruhnau et al. |
| D578,226 S | 10/2008 | West et al. |
| 7,432,534 B2 | 10/2008 | Yoo et al. |
| 7,432,536 B2 | 10/2008 | Slater, Jr. et al. |
| 7,432,589 B2 | 10/2008 | Yamamoto et al. |
| 7,432,642 B2 | 10/2008 | Murazaki |
| 7,432,647 B2 | 10/2008 | Nagatomi et al. |
| 7,436,002 B2 | 10/2008 | Brunner et al. |
| 7,436,066 B2 | 10/2008 | Sonobe et al. |

| | | | |
|---|---|---|---|
| 7,439,091 | B2 | 10/2008 | Chen et al. |
| 7,439,609 | B2 | 10/2008 | Negley |
| 7,442,254 | B2 | 10/2008 | Kiyoku et al. |
| 7,442,644 | B2 | 10/2008 | Nogami |
| 7,442,966 | B2 | 10/2008 | Bader et al. |
| D580,380 | S | 11/2008 | Tokuda |
| 7,445,354 | B2 | 11/2008 | Aoki et al. |
| 7,446,343 | B2 | 11/2008 | Mueller et al. |
| 7,446,344 | B2 | 11/2008 | Fehrer et al. |
| 7,446,345 | B2 | 11/2008 | Emerson et al. |
| 7,446,346 | B2 | 11/2008 | Harle |
| 7,452,737 | B2 | 11/2008 | Basin et al. |
| 7,456,499 | B2 | 11/2008 | Loh et al. |
| D582,865 | S | 12/2008 | Edmond et al. |
| D582,866 | S | 12/2008 | Edmond et al. |
| 7,462,861 | B2 | 12/2008 | Slater, Jr. et al. |
| 2002/0012247 | A1 | 1/2002 | Kamiya et al. |
| 2002/0017844 | A1 | 2/2002 | Parkyn et al. |
| 2002/0080615 | A1 | 6/2002 | Marshall et al. |
| 2002/0080622 | A1 | 6/2002 | Pashley et al. |
| 2002/0123164 | A1 | 9/2002 | Slater et al. |
| 2002/0127864 | A1 | 9/2002 | Smith et al. |
| 2002/0141006 | A1 | 10/2002 | Pocius et al. |
| 2002/0163808 | A1 | 11/2002 | West et al. |
| 2003/0002272 | A1 | 1/2003 | Suehiro et al. |
| 2003/0036217 | A1 | 2/2003 | Richard |
| 2003/0089914 | A1 | 5/2003 | Chen |
| 2003/0132447 | A1 | 7/2003 | Yukimoto |
| 2003/0156416 | A1 | 8/2003 | Stopa et al. |
| 2004/0016717 | A1 | 1/2004 | Hwu et al. |
| 2004/0036080 | A1 | 2/2004 | Bogner et al. |
| 2004/0046489 | A1 | 3/2004 | Vetorino et al. |
| 2004/0079957 | A1 | 4/2004 | Andrews et al. |
| 2004/0114393 | A1 | 6/2004 | Galli |
| 2004/0120153 | A1 | 6/2004 | Pate |
| 2004/0126913 | A1 | 7/2004 | Loh |
| 2004/0155565 | A1 | 8/2004 | Holder et al. |
| 2004/0201987 | A1 | 10/2004 | Omata |
| 2004/0207774 | A1 | 10/2004 | Gothard |
| 2004/0218390 | A1 | 11/2004 | Holman et al. |
| 2004/0222426 | A1 | 11/2004 | Hsiung |
| 2004/0232825 | A1 | 11/2004 | Sorg |
| 2004/0233665 | A1 | 11/2004 | West et al. |
| 2005/0001230 | A1 | 1/2005 | Takekuma |
| 2005/0006651 | A1 | 1/2005 | LeBoeuf et al. |
| 2005/0007777 | A1 | 1/2005 | Klipstein et al. |
| 2005/0018248 | A1 | 1/2005 | Silverbrook |
| 2005/0024887 | A1 | 2/2005 | Boyler |
| 2005/0047729 | A1 | 3/2005 | Vilgiate |
| 2005/0063181 | A1 | 3/2005 | Chiba et al. |
| 2005/0073840 | A1 | 4/2005 | Chou et al. |
| 2005/0073849 | A1 | 4/2005 | Rhoads et al. |
| 2005/0077529 | A1 | 4/2005 | Shen |
| 2005/0173719 | A1 | 8/2005 | Yonekubo |
| 2005/0195488 | A1 | 9/2005 | McCabe et al. |
| 2006/0046622 | A1 | 3/2006 | Prasad |
| 2006/0094340 | A1 | 5/2006 | Ouderkirk et al. |
| 2006/0108590 | A1 | 5/2006 | Kawaguchi |
| 2006/0192194 | A1 | 8/2006 | Erchak et al. |
| 2007/0108459 | A1 | 5/2007 | Lu |
| 2007/0152230 | A1 | 7/2007 | Duong et al. |
| 2008/0080166 | A1 | 4/2008 | Duong et al. |
| 2008/0081531 | A1 | 4/2008 | Duong et al. |
| 2009/0085043 | A1 | 4/2009 | Song et al. |
| 2009/0085052 | A1 | 4/2009 | Ko et al. |
| 2009/0087937 | A1 | 4/2009 | Kim |
| 2009/0087994 | A1 | 4/2009 | Lee et al. |

FOREIGN PATENT DOCUMENTS

| | | |
|---|---|---|
| JP | 2003-53647 | 2/2003 |
| JP | P3900144 | 1/2007 |
| WO | WO2007061638 | 5/2007 |
| WO | WO 2007081719 A2 | 7/2007 |
| WO | WO 2008042351 A3 | 4/2008 |

OTHER PUBLICATIONS

Samsung files patents ahead of LED spin-out, Apr. 2, 2009, downloaded Apr. 14, 2009 at http://compoundsemiconductor.net/cws/article/news/38551, 2 pages.

Office Action issued in U.S. Appl. No. 11/906,194, mailed Jul. 24, 2009, 7 pgs.

International Search Report and Written Opinion, International Patent Application No. PCT/US09/48788, mailed Aug. 14, 2009, 6 pgs.

International Search Report and Written Opinion, International Patent Application No. PCT/US09/48787, mailed Aug. 19, 2009, 7 pgs.

Office Action issued in U.S. Appl. No. 11/649,018, mailed Sep. 4, 2009, 18 pgs.

International Search Report and Written Opinion issued in PCT/US2009/033429 dated Apr. 15, 2009, Illumitex, Inc., 9 pages.

International Preliminary Report on Patentability and Written Opinion issued in PCT/US2007/021117 dated Apr. 7, 2009, Illumitex, Inc., 8 pages.

International Search Report and Written Opinion issued in International Patent Application No. PCT/US07/00102 mailed Mar. 28, 2008, 10 pages.

International Search Report and Written Opinion issued in International Patent Application No. PCT/US07/21117 mailed Mar. 25, 2008, 10 pages.

International Preliminary Examination Report mailed Jul. 17, 2008 for International Application No. PCT/US2007/000102, 6 pages.

Light-Emitting Diode, Wikipedia, Nov. 17, 2008, pp. 1-15, at http://en.wikipedia.org/wiki/Light-emitting_diode.

Cree XLamp LED Reliability, Cree LED Light, Sep. 2007, pp. 1-9, Cree, Inc., Durham, NC 27703, at www.cree.com/xlamp.

Golden Dragon Engineering Kit, OSRAM Opto Semiconductors GmbH, Oct. 4, 2006, Regensburg, Germany, at www.osram-os.com, 6 pages.

Power Light Source Luxeon Rebel, Technical Datasheet DS56, Philips, Jul. 2008, Philips Lumileds Lighting Company, US, at www.luxeon.com, 34 pages.

Specification for NICHIA Chip Type White LED, Model NSSW108T, Cat. No. 070606, 13 pages, NICHIA Corporation.

Haque, High-power LED Stud-bump Packaging, Advanced Packaging, Apr. 2006, pp. 1-6, at http://ap.pennnet.com/Articles/Article_Display.cfm?Section+ARTCL&ARTICLE_ID=252779&VERSI.

Wong et al., Packaging of Power LEDS Using Thermosonic Bonding of Au-Au Interconnects, SMTA Int'l Conf., Sep. 24, 2006, pp. 1-2, SMTA, Edina, MN at www.smta.org.

Moreno, LED Intensity Distribution, International Optical Design Conf. 2006, Jun. 2006, Optical Society of America, ISBN: 1-55752-814-4, 3 pages.

Moreno et al., Modeling the Radiation Pattern of LEDs, Optics Express, Feb. 4, 2008, vol. 16, No. 3, Optical Society of America #90469, 12 pages.

Cho et al., Dry etching of GaN and related materials; Comparison of Techniques, IEEE Journal of Selected Topics in Quantum Electronics, 1998, 4(3):557-563, 11 pages.

Mishra, GaN Vacuum Microelectronic Electron Emitter with Integrated Extractor, Santa Barbara CA, Jan. 28, 2009 at my.ece.ucsb.edu/mishra/vacuummicroelec/finalrepnsf.pdf, 4 pages.

He, GaN layers re-grown on etched GaN templates by plasma assisted molecular beam epitaxy, Mat. Res. Soc. Symp. vol. 798, 2004 Materials Research Society, Richmond, VA, 4 page.

Gallium Nitride Film Growth, downloaded Feb. 6, 2009 at www.onr.navy.mil/sci_tech/31/312/ncsr/materials/gan/filmgrowth.asp?css printer&, 7 pages.

The Asymmetric Reflector, Elliptipar, West Haven, CT, 2 pages, downloaded from http://www.elliptipar.com/reflector.asp on Mar. 27, 2009.

Sports Lighting Solutions, Lighting Information, Abacus Lighting Limited, Nottinghamshire, England, 3 pages, downloaded from http://www.abacuslighting.com/sportslighting.asp?sport=sn03 on Mar. 27, 2009.

Office Action Mailed May 13, 2010 in U.S. Appl. No. 11/906,219. 14 pages.

* cited by examiner

SYSTEM AND METHOD FOR EMITTER LAYER SHAPING

CROSS-REFERENCE TO RELATED APPLICATIONS

This application claims the benefit of priority under 35 U.S.C. 119(e) to U.S. Provisional Patent Applications No. 61/027,354, entitled "EMITTER LAYER SHAPING," filed Feb. 8, 2008, and No. 61/049,964, entitled "EMITTER LAYER SHAPING," filed May 2, 2008. This application relates to U.S. patent applications Ser. No. 11/906,219, entitled "LED SYSTEM AND METHOD," filed Oct. 1, 2007, and Ser. No. 11/906,194, entitled "LED SYSTEM AND METHOD," filed Oct. 1, 2007, both of which claim priority from U.S. Provisional Patent Applications No. 60/827,818, entitled "SHAPED LIGHT EMITTING DIODES," filed Oct. 2, 2006, and No. 60/881,785, entitled "SYSTEM AND METHOD FOR A SHAPED SUBSTRATE LED," filed Jan. 22, 2007. All applications referenced herein are hereby fully incorporated.

FIELD OF THE DISCLOSURE

The present disclosure relates generally to light-emitting diode (LED) devices and, more particularly, to systems and methods for shaping the emitter material to maximize the light extraction efficiency of any LED.

BACKGROUND

Light emitting diodes ("LEDs") are ubiquitous in electronics. They are used in digital displays, lighting systems, computers, televisions, cellular telephones, and a variety of other devices. Developments in LED technology have led to methods and systems for the generation of white light using one or more LEDs. Developments in LED technology have led to LEDs that generate more photons and thus more light than previously. The culmination of these two technological developments is that LEDs are being used to supplement or replace many conventional lighting sources, e.g., incandescent, fluorescent or halogen bulbs, much as the transistor replaced the vacuum tube in computers.

LEDs are produced in a number of colors including red, green, and blue. One method of generating white light involves the use of red, green and blue LEDs in combination with one another. A lighting source that is made of combinations of red, green, and blue (RGB) LEDs will produce what is perceived as white light by the human eye. This occurs because the human eye has three types of color receptors, with each type sensitive to either blue, green or red colors.

A second method of producing white light from LED sources is to create light from a single-color (e.g., blue), short wavelength LED, and impinge a portion of that light onto phosphor or similar photon conversion material. The phosphor absorbs the higher energy, short wavelength light waves, and re-emits lower energy, longer wavelength light. If a phosphor is chosen that emits light in the yellow region (between green and red), for example, the human eye perceives such light as white light. This occurs because the yellow light stimulates both the red and green receptors in the eye. Other materials, such as nano-particles or other similar photo-luminescent materials, may be used to generate white light in much the same way.

White light may also be generated utilizing an ultraviolet (UV) LED and three separate RGB phosphors. Additionally, white light may be generated from a blue LED and a yellow LED and may also be generated utilizing blue, green, yellow and red LEDs in combination.

Current industry practice for construction of LEDs is to use a substrate (typically either single-crystal sapphire or silicon carbide), onto which is deposited layers of materials such as GaN or InGaN. One or more layers (e.g., GaN or InGaN) may allow photon generation and current conduction. Typically, a first layer of gallium nitride (GaN) is applied to the surface of the substrate to form a transition region from the crystal structure of the substrate to the crystal structure of doped layers allowing for photon generation or current conduction. This is typically followed by an n-doped layer of GaN. The next layer can be an InGaN, AlGaN, AlInGaN or other compound semiconductor material layer that generates photons and that is doped with the needed materials to produce the desired wavelength of light. The next layer is typically a P doped layer of GaN. This structure is further modified by etching and deposition to create metallic sites for electrical connections to the device.

During the operation of an LED, as in a traditional diode, extra electrons move from an n-type semiconductor to electron holes in a p-type semiconductor. In an LED, photons are released in the compound semiconductor layer to produce light during this process.

In a typical manufacturing process, the substrate is fabricated in wafer form and the layers are applied to a surface of the wafer. Once the layers are doped or etched and all the features have been defined using the various processes mentioned, the individual LEDs are separated from the wafer. The LEDs are typically square or rectangular with straight sides. This can cause significant efficiency losses and can cause the emitted light to have a poor emission pattern. A separate optical device, such as a plastic dome, is often placed over the LED to achieve a more desirable output.

In many LED applications, it is desirable to maximize visible light output for a given power input, a quantity often expressed in lumens per watt (lm/W) for white light, or milliwatts per watt (mW/W) for shorter wavelength light such as blue. Existing LED technologies may attempt to increase this ratio, typically referred to as "overall efficiency" or "wall-plug efficiency." However, existing LED technologies still suffer poor overall efficiency and low extraction efficiency.

SUMMARY

Embodiments of a Complete Emitter Layer Shaping (CELS) process disclosed herein can provide a geometric and optic solution in maximizing the light extraction efficiency of any light emitting diode through shaping the emitter material thereof. In some embodiments, this process is referred to as GaN shaping.

Embodiments disclosed herein are stated in terms of electromagnetic spectra commonly associated with light, including ultraviolet, visible and infrared light. The principles disclosed herein can be applied to any wavelength of electromagnetic radiation for which suitable materials used are transparent to the wavelength of interest. As one skilled in the art can appreciate, the emitter layer shaping method and system disclosed herein may be similarly implemented to suit a broad range of wavelengths. An example of a wavelength range of interest is the Terahertz frequency range.

The emitting material of an LED can be grown on a number of substrates. Currently, the majority of InGaN LEDs are grown on a sapphire substrate. The index of sapphire is much lower than the emitting material (InGaN) and therefore the number of photons that gets into the sapphire substrate is greatly reduced. In shaping the emitting material, all of the light emitted from the GaN material can escape into the sapphire substrate and, ultimately, air.

Nearly all blue and green LEDs on the market today are built using GaN (gallium nitride) as the first layer of material that is applied to a sapphire or silicon carbide substrate. Also, the actual layers that are applied are varied and complex, including not only GaN but also the compound semiconductor materials such as InGaN, AlInGaP, and the like. Current developments in the science today include the use of other materials besides GaN for the LED layers. The techniques described in this application apply to any and all such layers in a light emitting device. The phrases "Complete Emitter Layer Shaping" and "CELS" and "GaN Shaping" used herein are meant to cover all such activities, whether actually shaping GaN, some other materials, or a combination of them. For the purposes of calculations and examples, GaN is used as the emitting material throughout this application. However, those skilled in the art will appreciate that the equations and descriptions apply equally across other material sets and are not limited by the examples disclosed herein.

Conventional LEDs suffer from poor light extraction efficiency due to the high index of refraction in which the light energy is generated. In transitioning from a high index material to a lower index material, total internal reflection (TIR) limits the escape cone of the light. The escape cone angle is the critical angle. This critical angle can be calculated using Snell's Law.

In one embodiment, a portion of the emitter layer of an LED is shaped to a controlled depth or height relative to a substrate of the LED. In embodiments disclosed herein, the emitter layer comprises an array of miniature emitters, also referred to as micro-LEDs. In some embodiments, each of the micro-LEDs has a square, rectangular, or hexagon shape. In some embodiments, the emitter layer is shaped by etching. In one embodiment, the substrate is sapphire. In one embodiment, the emitter layer material is in continuous contact with the substrate. In one embodiment, the emitter layer material is in electrical contact with the substrate. In one embodiment, the emitter layer material forms an electrical plane or continuous electrical connection with the substrate.

In some embodiments, only a portion of the emitter layer is shaped. In some embodiments, the emitter layer of an LED comprises a shaped portion and an unshaped portion or region. In some embodiments, the shaped portion of the emitter layer has a controlled depth or height and the unshaped portion or region of the emitter layer forms an electrical plane or generally continuous electrical connection and is generally in continuous contact with the substrate. In some embodiments, the unshaped portion of the emitter layer may be coupled to a power source at the edges. In some embodiments, one or more shaped portions of the emitter layer may be coupled to a power source.

In one embodiment, a limiting ray may traverse the longest distance or approximately the longest distance in the shaped portion of the emitter layer. In some embodiments, the limiting ray may be selected to generally terminate at the depth or height of the shaped portion of the emitter layer relative to the substrate. In some embodiments, the emitter layer material may be shaped based on one or more limiting rays which traverse a longest distance or approximately a longest distance in a shaped portion of the emitter layer.

In some embodiments, the sidewalls of the LED may also be shaped to maximize the light output of the LED using total internal reflection and to achieve a desired intensity distribution. In some embodiments, the exit face of the LED may be selected to conserve radiance.

In some embodiments, the sidewall shape of an LED is empirically determined based on the following constraints:
  All rays emanating from the emitter that strike a sidewall should strike the sidewall at an angle greater than or equal to the critical angle
  All rays reflecting off the sidewalls should reflect toward the exit surface and the angle of incidence at the exit surface has to be less than the critical angle.

In some embodiments, criteria for the sidewall shape may further include uniformity of light intensity at the exit face or a Gaussian distribution at infinity, or both, or other sets of conditions. In this way, the sidewalls can be shaped to ensure that emitted light is directed to the substrate at a desired intensity or angle. In some embodiments, the desired intensity or angle may be determined based on the properties of the substrate such as, for example, the index of refraction of the substrate, the emitter material or other materials.

Embodiments disclosed herein provide many advantages. For example, shaping the entire LED, including the substrate, or shaping the substrate alone, can achieve extracting 100% or approximately or generally 100% of the light generated at the emitter layers from the emitter layers. In some embodiments, through shaping the emitter material as disclosed herein, a light emitting diode can achieve the light extraction efficiency at a minimum of approximately 90% and above.

Another advantage provided by embodiments disclosed herein is the ability to shape a large array of tiny emitters, also referred to as micro-LEDs, to create a single LED. For example, in some embodiments, the emitter layer of an LED may comprise one or an array of a few micro-LEDs to several millions of micro-LEDs.

Yet another advantage provided by embodiments disclosed herein is that, with tiny emitters (micro-LEDs), the overall volume of light emitting material that needs to be removed in shaping the emitter layer can also be reduced. Additionally, with embodiments disclosed herein, little or none of the substrate material need to be removed, which may speed the production of LEDs and reduce the cost of producing LEDs as the substrate material may be difficult and/or costly to remove, such as, for example, in the case of sapphire.

Embodiments disclosed herein may provide additional advantages for mounting, heat dissipation and uniformity of illumination. For example, the emitting base of each micro-LED may be bonded directly to a submount that provides power to the micro-LED and also provides a heat removal path for the micro-LEDs. This construction can provide excellent heat spreading. Because the emitters are spread away from each other, the heat density can also be reduced. As another example, the escape angle of each micro-LED, combined with the very small size of each micro-LED, can allow the exit rays from one micro-LED to overlap the exit rays of a large number of neighboring micro-LEDs while the light is still contained within the thickness of the substrate. By the time the light reaches the exit face of the substrate, the light from many micro-LEDs is averaged, creating a very uniform light output profile.

In summary, embodiments disclosed herein can provide technological advantages in the following areas:
1. Current spreading
2. Heat removal
3. Uniformity of emission
4. Increased percentage of active area (P layer) relative to inactive area (N layer) contacts
5. Higher external quantum efficiency
6. Lower heat generated per lumen due to higher extraction efficiency
7. Conserve true brightness Other objects and advantages of the embodiments disclosed herein will be better understood and appreciated when considered in conjunction with the following description and the accompanying drawings.

BRIEF DESCRIPTION OF THE DRAWINGS

The drawings accompanying and forming part of this specification are included to depict certain aspects of the disclosure. A clearer impression of the disclosure will become more readily apparent by referring to the exemplary, and therefore non-limiting, embodiments illustrated in the drawings. Wherever possible, the same reference numbers will be used throughout the drawings to refer to the same or like features (elements). The drawings are not necessarily drawn to scale.

DETAILED DESCRIPTION

Figure 1:
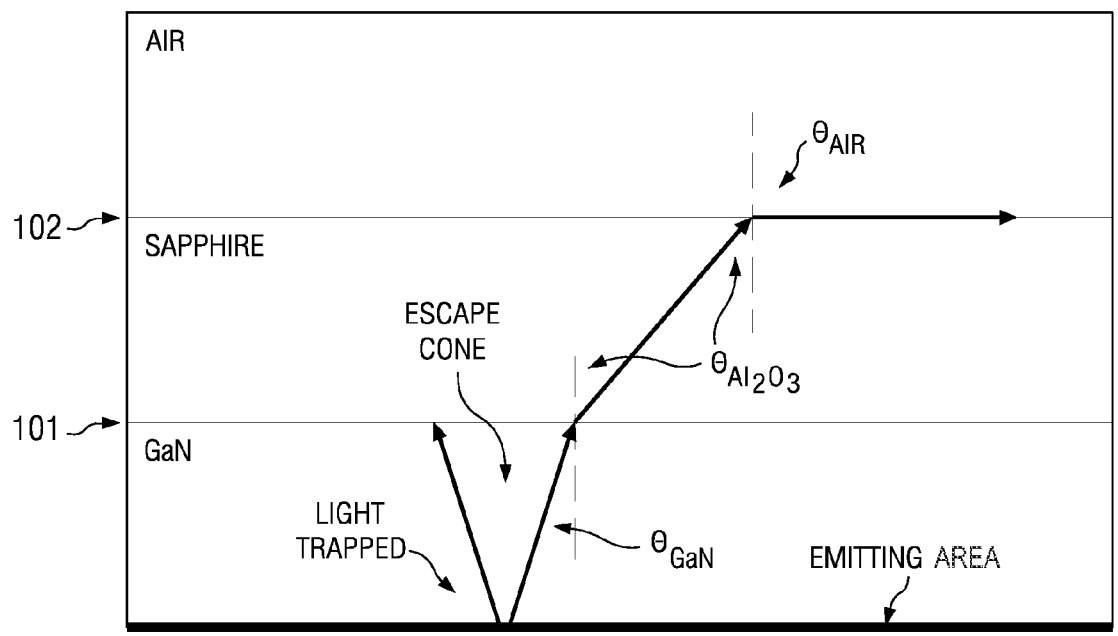
FIG. 1 is a diagrammatic illustration of one example of how total internal reflection (TIR) may limit the escape cone of the light, causing low light extraction efficiency.

The disclosure and various features and advantageous details thereof are explained more fully with reference to the exemplary, and therefore non-limiting, embodiments illustrated in the accompanying drawings and detailed in the following description. Descriptions of known starting materials and processes may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like.

Reference is now made in detail to the exemplary embodiments of the disclosure, examples of which are illustrated in the accompanying drawings. Wherever possible, like numerals will be used throughout the drawings to refer to like and corresponding parts (elements) of the various drawings.

In embodiments disclosed herein, an LED may be shaped in various ways to increase or manipulate the light emission from the LED. In one embodiment, the substrate is shaped so that all or a supermajority of the light generated by the quantum well region of the LED is transmitted out the exit face of the substrate of the LED. To this end, the exit face can be sized to take into account principles of conservation of radiance. In one embodiment, the exit face may be the minimum size that allows all or a supermajority of the light entering the substrate through the interface between the quantum well region and the substrate to exit the exit face, thereby combining the desire to conserve radiance with the desire to reduce size, particularly the size of the exit face. Additionally, the sidewalls of the substrate may be shaped so that reflection or total internal reflection ("TIR") causes light beams incident on substrate sidewalls to reflect towards the exit face and be incident on the exit face with an angle less than or equal to the critical angle. Consequently, light loss due to TIR at the exit face is reduced or eliminated. In a further embodiment, to ensure that light striking a sidewall is reflected within the substrate and does not pass through the sidewall, a sidewall or sidewalls of a substrate may also be coated with a reflective material that reflects light to prevent the exitance of light through the sidewall. Detailed examples of systems and methods for shaping LED substrates and sidewalls are described in the above-referenced U.S. patent application Ser. Nos. 11/906,219 and 11/906,194, entitled "LED SYSTEM AND METHOD," filed Oct. 1, 2007, both of which are fully incorporated herein for all purposes.

The emitting material of an LED can be grown on a number of substrates. Nearly all blue and green LEDs on the market today are built using GaN (gallium nitride) as the first layer of material that is applied to a sapphire or silicon carbide substrate. Also, the actual layers that are applied can be varied and complex, including not only GaN but also the compound semiconductor materials such as InGaN, AlInGaP, and the like. Currently, the majority of InGaN LEDs are grown on sapphire substrates. The index of refraction of sapphire is much lower than that of the emitting material (InGaN) and therefore the number of photons that gets into the sapphire substrate is greatly reduced. In transitioning from a high index material to a lower index material, TIR limits the escape cone of the light. The escape cone angle is the critical angle. This critical angle can be calculated using Snell's Law.

Snell's law, also known as the law of refraction, is a formula used to describe the relationship between the angles of incidence and refraction, when referring to light or other waves, passing through a boundary between two different isotropic media, such as water and glass. Snell's law states that the ratio of the sines of the angles of incidence and of refraction is a constant that depends on the media indices.

FIG. 1 is a diagrammatic illustration of how light travels through different media of LED structure 100. In the example of FIG. 1, there is a first boundary (interface 101) between gallium nitride (GaN) and sapphire and a second boundary (interface 102) between sapphire and air. The much lower index of refraction of sapphire causes some photons to be trapped in the emitting material, which has a higher index of refraction. The amount of light trapped in the emitting material is inversely related to the light extraction efficiency of an LED. The more light is trapped in the GaN material, the less efficient the LED is. Shaping the emitting material according to embodiments of a Complete Emitter Layer Shaping (CELS) process disclosed herein can facilitate light emitted from GaN to escape into the sapphire substrate and ultimately from sapphire to air. According to embodiments disclosed herein, the CELS process can maximize the light extraction efficiency of any light emitting diode through shaping the emitter material. As GaN is used herein as the example emitting material, this process is also referred to herein as GaN shaping.

Assuming the index of air is 1, the index of sapphire is 1.77 and the index of GaN is 2.5, then the exit angle in GaN can be calculated:

$$n_{air} \sin \Theta_{air} = n_{Al_2O_3} \sin \Theta_{Al_2O_3} \quad [\text{EQN. 1}]$$
$$n_{GaN} \sin \Theta_{GaN} = n_{Al_2O_3} \sin \Theta_{Al_2O_3}$$
$$= n_{air} \sin \Theta_{air}$$
$$\sin \Theta_{GaN} = \frac{n_{air} \sin \Theta_{air}}{n_{GaN}}$$
$$= \frac{n_{air}}{n_{GaN}}$$
$$= \frac{1}{2.5}$$
$$\Theta_{GaN} = \sin^{-1} \frac{1}{2.5}$$
$$= 23.58°$$

The critical angle in this example is 23.58 degrees for light that is created in GaN. One assumption here is that there is a partially or fully reflective layer below the emitting area and therefore light is only emitted into a hemisphere.

The escape cone is a small fraction of the total light emitted. To calculate the amount of energy lost, we calculate the projected solid angle of the escape cone versus a lambertian emitter. A lambertian emitter's solid angle is Pi steradians. The solid angle of a 23.58 degree escape cone is:

$$\Omega = \pi \sin^2(\theta_{1/2}) \quad [\text{EQN. 2}]$$
$$\varepsilon = \Omega / \pi$$
$$= \sin^2(\theta_{1/2})$$
$$= 0.16$$
$$= 16\%$$

The light extraction efficiency is approximately 16%; meaning that 16% of the energy that is created within the emitting material (GaN) escapes the top surface of the LED in the example of FIG. 1.

While many in the industry focus on how to disrupt or limit TIR at the various high index to low index interfaces within the LED structure, embodiments disclosed herein focus on why there is TIR at these interfaces. TIR occurs because of Brightness. The Brightness Theorem, also called the Conservation of Radiance Theorem, is the Conservation of Energy Theorem applied to optics. The Conservation of Radiance Theorem states that the radiance of a system must be conserved.

The Conservation of Radiance Theorem is:

$$\frac{\phi}{n^2 A \Omega} = \frac{\phi_1}{n_1^2 A_1 \Omega_1} \quad [\text{EQN. 3}]$$
$$A_1 = \frac{\phi_1 n^2 A \Omega}{\phi n_1^2 \Omega_1}$$
$$\phi = \text{Flux}$$
$$n = \text{index\_of \_refraction}$$
$$A = \text{area}$$
$$\Omega = \text{solid\_angle}$$

Assuming all the energy that is created escapes out of $A_1$ and assuming that the initial emission pattern and final emission pattern are lambertian, the equation reduces to:

$$\phi_1 = \phi \quad [\text{EQN. 3a}]$$
$$\Omega_1 = \Omega$$
$$A_1 = \frac{\phi_1 n^2 A \Omega}{\phi n_1^2 \Omega_1}$$

-continued $$= \frac{n^2}{n_1^2} A$$

The brightness equation dictates that in transitioning from a material of a given index of refraction to a material of a lower index of refraction, the emission area in the lower index material must increase. This assumes that the flux is conserved and the solid angles are the same-lambertian. This increase is directly related to the square of the ratio of indices.

In transitioning from a small emitter area in a high index material to a larger area of a lower index, the sidewalls are shaped to make use of total internal reflection. The light emitted from the quantum well region reflects off the sidewalls via total internal reflection toward the larger area. All rays (or some amount of rays determined by design) emanating from the emitter hit the sidewall at angles greater than the critical angle and reflect internally. The rays that strike the exit are preferably at angles less than the critical angle and pass through the exit face into the large area in the lower index material. Thus, the system brightness is preserved via the optical system defined by the sidewalls.

Suppose the base substrate is sapphire, the emitting material is GaN, and the desired exit angle is 90 deg, lambertian, the exit area can be calculated via the Brightness Theorem [EQN. 3]. EQN. 3a above shows the derivation of the exit area. The exit area to input area ratio is equal to the square of the ratio of indices. As an example, for an emitting medium having an index of refraction of 2.5 and the ending medium of air, the exit area is equal to the square of 2.5 times the input area, assuming that the output emission is lambertian. In this example, the exit area to emitter area ratio is 6.25:1.

Figure 2A:
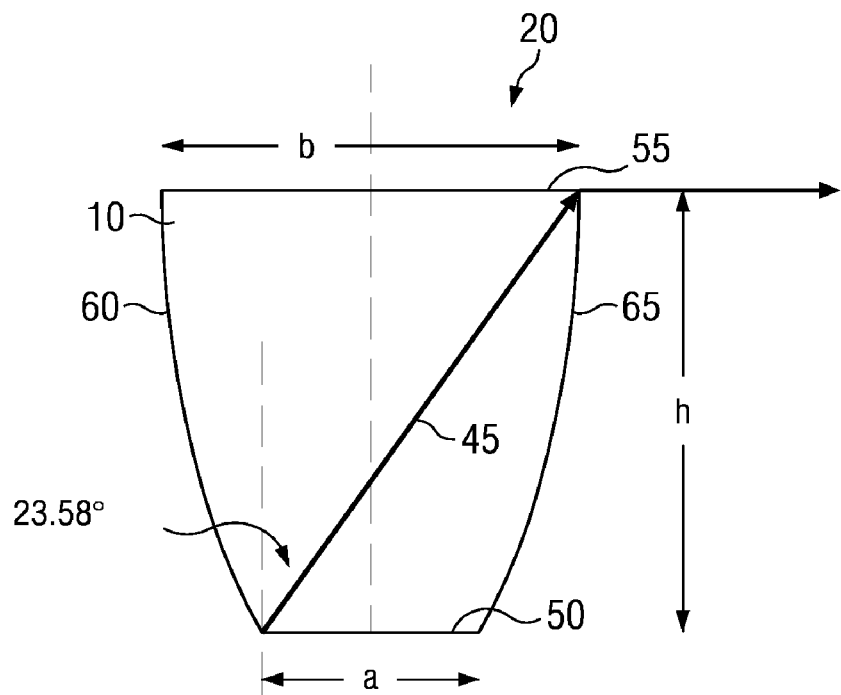
FIGS. 2A and 2B show various views of a diagrammatic representation of one embodiment of square emitter comprising a shaped substrate with shaped sidewalls.
Figure 2B:
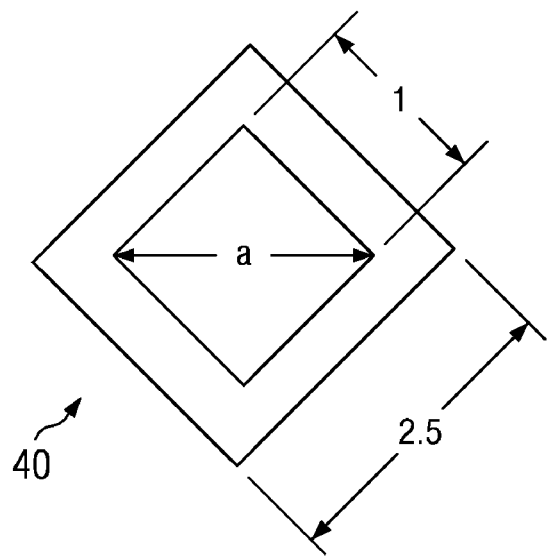

FIGS. 2A and 2B show top and side views of a diagrammatic representation of an example embodiment of square emitter 20 comprising shaped portion 10 and shaped sidewalls 60, 65. In some embodiments, exit face 55 may be substantially the same shape as, substantially parallel to and substantially rotationally aligned with interface 50 within the tolerance of the manufacturing process. In some embodiments, the shape of exit face 55 may be different than that of interface 50.

The area of exit face 55 can be chosen to conserve brightness according to the Brightness Theorem [EQN. 3]. EQN. 3b below shows an example derivation of the exit area.

$$\frac{\Phi_2 n_1^2 A_1 \Omega_1}{\Phi_1 n_2^2 \Omega_2} = A_2 \quad [\text{EQN. 3b}]$$

$\phi_1$=light flux traversing interface 50;
$\phi_2$=light flux exiting exit face 55, $\phi_1$=$\phi_2$ for conservation of brightness;
$\Omega_1$=effective solid angle whereby light traverses interface 50;
$\Omega_2$=effective solid angle whereby light leaves exit face 55;
$A_1$=area of interface 50;
$A_2$=area of exit face 55;
$n_1$=refractive index of material of substrate 10;
$n_2$=refractive index of substance external to substrate 10 (e.g. air or other medium).

$A_2$ represents the minimum surface area of exit face 55 such that light is conserved per the above equation. Assume, for example: quantum well region 15 forms a 1 mm square so that interface 50 has an area approximately 1 mm square, $n_1$=1.77, $n_2$=1, $\Omega_1$=3, $\Omega_2$=1, and phi1 equals phi2 then $A_2$ must be at least 9.3987 mm² to conserve radiance. In this example, the effective solid angles, $\Omega_1$ and $\Omega_2$, n1 and n2, phi1 and phi2 are given. Readers are directed to the above-referenced U.S. patent application Ser. Nos. 11/906,219 and 11/906,194, entitled "LED SYSTEM AND METHOD," filed Oct. 1, 2007, for additional teachings on determining the effective solid angles.

$A_2$ represents the minimum surface area of exit face 55 and the minimum possible size for a given output cone angle or Emission Half Angle to conserve radiance. In some embodiments, $A_2$ may be made slightly larger to compensate for tolerances in the manufacturing process, errors in the size or shape of the quantum well region or other factors. In cases where $A_2$ is made larger than the minimum thus determined, flux will be conserved, but exitance (defined as flux per unit area) may be reduced from the maximum attainable value.

The height of the device can be determined by the limiting ray in the system. This ray traverses the longest distance within the high index material to surface 55 without internally reflecting at surface 55. If the emission plane is a square, then the diagonal ray is the limiting ray. In the example shown in FIGS. 2A and 2B, since emission plane 40 is a square, diagonal ray 45 is the limiting ray.

For unit emitter with a side of 1 and an area of 1 square units and exit emitter side of 2.5 and area of 6.25, the minimum height for the device can be calculated:

$$a = \sqrt{2} \cdot 1 \quad [\text{EQN. 4}]$$
$$b = \sqrt{2} \cdot 2.5$$
$$\tan(\theta) = \frac{h}{\frac{1}{2}(a+b)}$$
$$h = \frac{1}{2}(a+b)\tan(\theta)$$
$$= \frac{\sqrt{2}}{2}(1+2.5)\tan(90-23.58)$$
$$h = 0.707 \cdot 3.5 \cdot 2.29$$
$$= 5.67$$

The Height:ExitEdge:EmitterEdge ratio for a square emitter is: 5.67:2.5:1. In some embodiments, empirical methods may be used to determine the height. Conservation of Radiance dictates the minimum exit area and not the height.

According to various embodiments, a portion of the emitter layer of an LED is shaped as disclosed above. More specifically, the emitter layer is shaped to a controlled depth or height relative to the substrate (which may be sapphire as discussed above) such that emitter layer material is generally in continuous contact with the substrate. Thus, in some embodiments, a continuous layer of emitter material may be in contact with the substrate. In some embodiments, a continuous layer of emitter material may be in electrical contact or forms an electrical plane or continuous electrical connection with the substrate. In some embodiments, only a portion of the emitter layer is shaped. In some embodiments, the emitter layer may comprise a shaped portion which may be shaped to a controlled depth or height and an unshaped portion or region.

The area of the interface between the emitter layer and substrate can be chosen as described above and the height of the emitter layer material can be chosen based on one or more limiting rays which traverse a longest distance or approximately a longest distance in a shaped portion of the emitter layer. As a specific example, FIG. 2A shows a shaped portion 10 of emitter 20 which is shaped to a controlled height (h). In this example, the shaped portion can be the emitter layer—by way of example, but not limitation—a GaN layer or other emitter layer. The unshaped portion of the emitter layer material of emitter 20 is not shown in FIG. 2A. In one embodiment, the limiting ray as discussed above traverses the longest distance or approximately the longest distance in the shaped portion of the emitter layer. Thus, in the example of FIG. 2A, limiting ray 45 may be selected to generally terminate at the depth or height (h) of the shaped portion of the emitter layer.

In one embodiment, the sidewall shape is empirically determined. There are two constraints on the sidewalls:
 a. All rays emanating from the emitter that strike a sidewall should strike the sidewall at an angle greater than or equal to the critical angle
 b. All rays reflecting off the sidewalls should reflect toward the exit surface and the angle of incidence at the exit surface has to be less than the critical angle.

Other criteria for the sidewall shape may be uniformity of light intensity at the exit or a Gaussian distribution at infinity, or both, or other sets of conditions. Thus, the sidewalls can be shaped so as to ensure that emitted light is directed to the substrate at a desired intensity or angle and the desired intensity or angle may be determined based on the properties of the substrate such as, for example, the index of refraction of the substrate, the emitter material or other materials.

In some embodiments, the shape of the sidewalls can be determined by iteration. A shape is broken up into n facets. Facets for a sidewall can be defined using a computer program such as Microsoft Excel (Microsoft and Excel are trademarks of Redmond, Wash.-based Microsoft Corporation). More specifically, the graphing feature in Microsoft Excel can be used to create a graph of a sidewall shape. The same general shape can be used for each sidewall or different shapes for different sidewalls. Using a program like Excel, the size and angle of each facet can be changed to attain the desired performance. Solid models for a shaped substrate with the specified sidewall shape (or with a curved sidewall shape based on the specified facets) can be created using any mechanical drafting program such as Solidworks, AutoCad, Pro Engineer, etc. Solid models can also be created and analyzed using any ray tracing program such as Zemax, TracePro, BRO, Lighttools, etc.

In physics, ray tracing is a method for calculating the path of waves or particles through a system with regions of varying propagation velocity, absorption characteristics, and reflecting surfaces. Under these circumstances, wavefronts may bend, change direction, or reflect off surfaces, complicating analysis. Ray tracing solves the problem by repeatedly advancing idealized narrow beams called rays through the medium by discrete amounts. Simple problems can be analyzed by propagating a few rays using simple mathematics. More detailed analyses can be performed by using a computer to propagate many rays. When applied to problems of electromagnetic radiation, ray tracing often relies on approximate solutions to Maxwell's equations that are valid as long as the light waves propagate through and around objects whose dimensions are much greater than the light's wavelength.

Using a commercially available ray tracing program, a computer simulation can be conducted to generate a ray trace and an intensity and irradiance distribution profile. If the resulting intensity and irradiance profile has an unsatisfactory distribution or the transmission efficiency of the shaped substrate is too low, the variables of the various facets can be adjusted and the simulations performed again. This process can be automated through the use of a computer program to automatically adjust facet variables. For purposes of illustration, the following examples utilize Zemax optical design program (Zemax is a trademark of Zemax Development Corporation of Bellevue, Wash.).

Zemax Models

Once a shape that meets the size constraints dictated by the brightness equation and the limiting ray considerations is made, it can be modeled in the ray tracing program. The ray tracing program will model the rays going through the shape to determine its efficiency, near and far field distribution.

Figure 3:
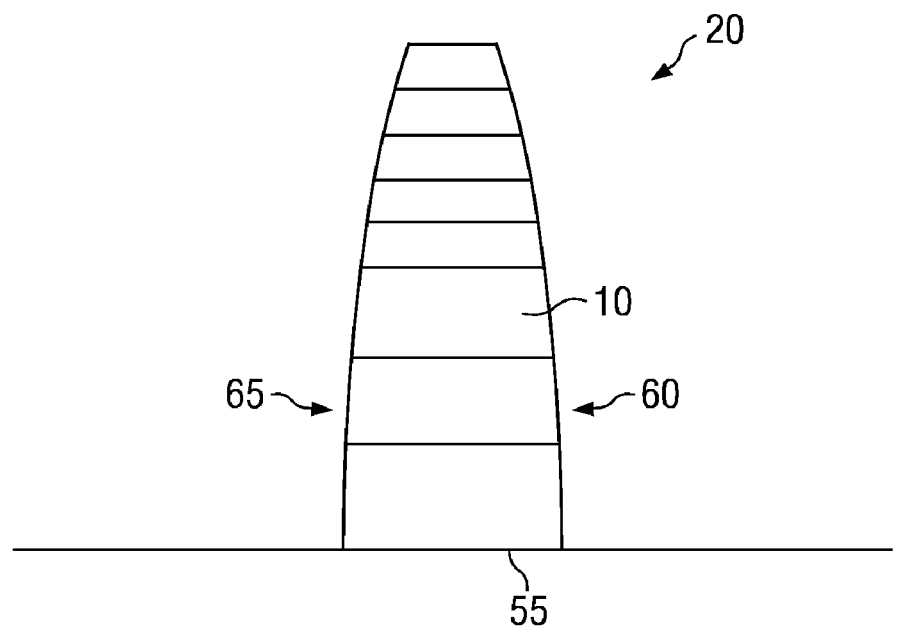
FIG. 3 is a side view of an example solid model of a shaped substrate with shaped sidewalls.

FIG. 3 is a side view of an example solid model of shaped portion 10 with shaped sidewalls 60, 65. Portion 10 with sidewalls 60, 65 represent a shaped portion of an emitter layer of square emitter 20. As a specific example, portion 10 is representative of a GaN material, index 2.5. The output distribution is lambertian.

Figure 4:
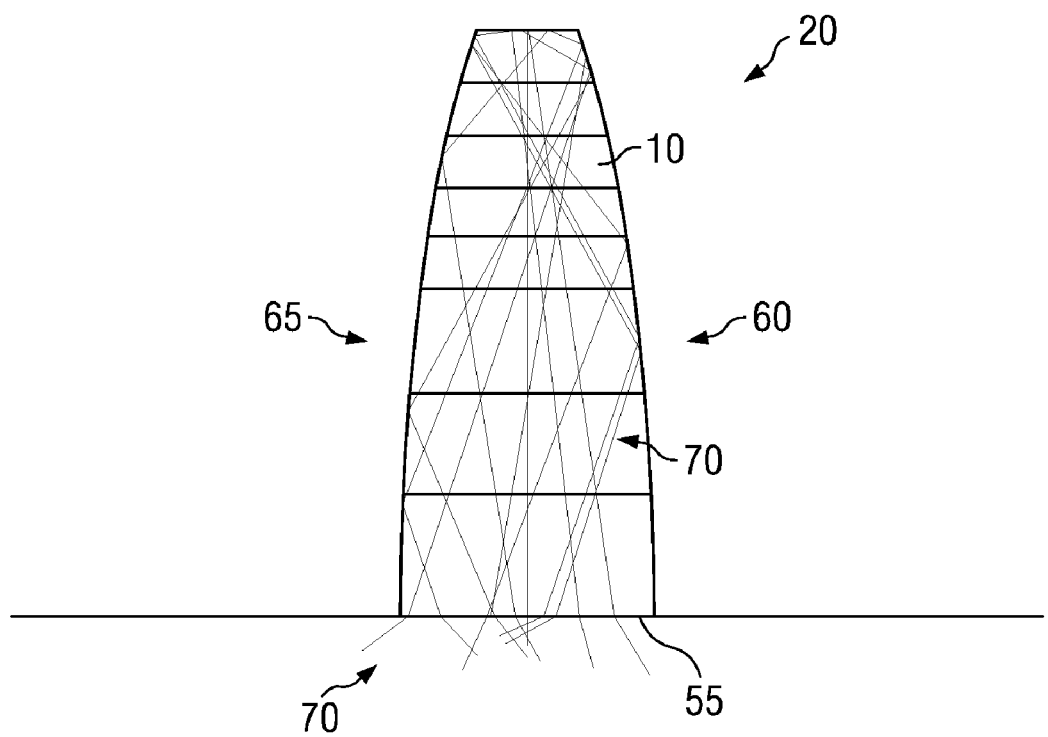
FIG. 4 shows one example of rays tracing though the solid model of FIG. 3, illustrating rays reflected from the shaped sidewalls to the exit surface.

FIG. 4 shows one example of rays tracing though the solid model of FIG. 3. Due to TIR, rays 70 reflect off sidewalls 60, 65 toward exit surface 55 where they refract and pass through exit face 55.

Figure 5:
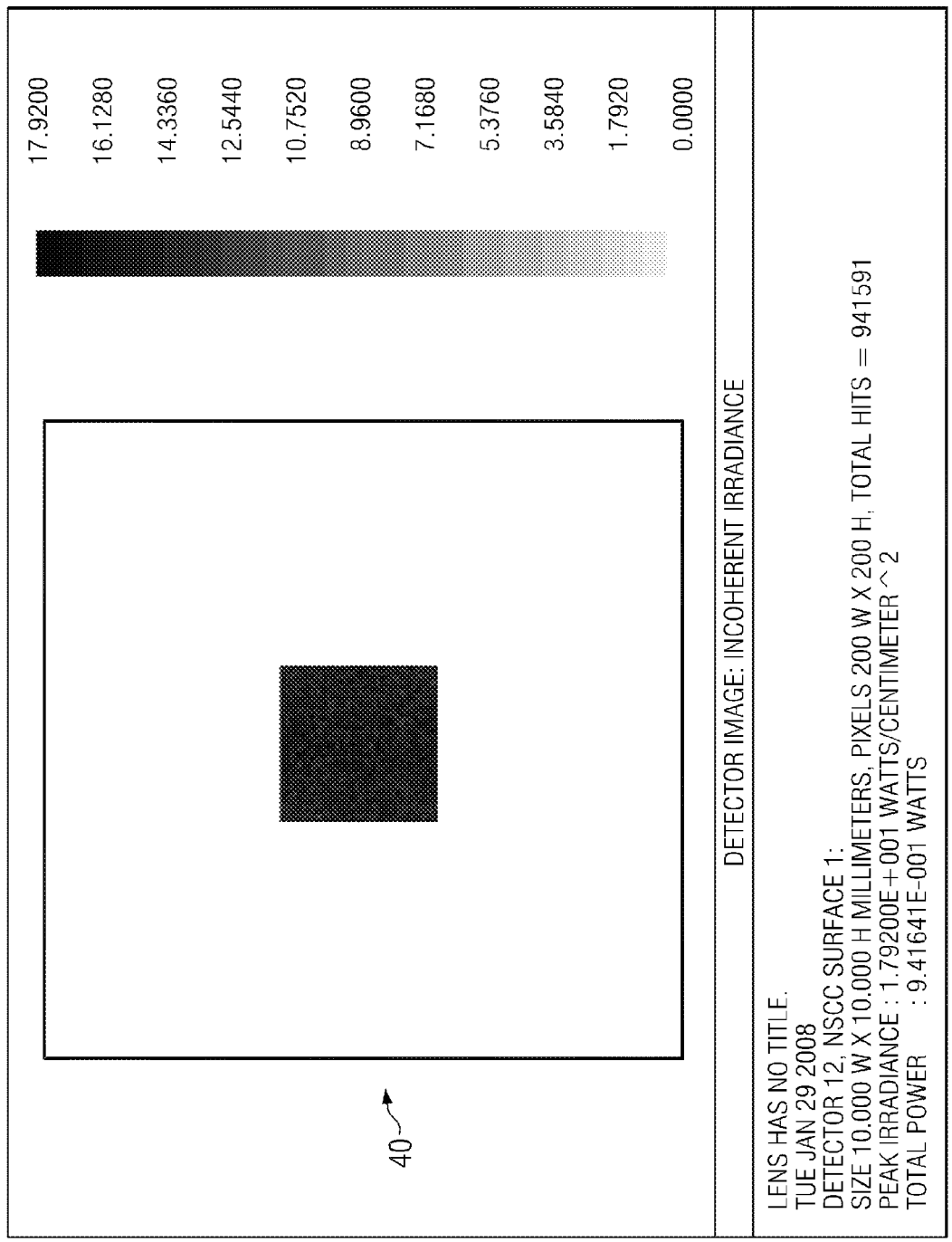
FIG. 5 is a screenshot of a solid model of a square emitter created in a ray tracing program, showing the near field distribution at the exit detector plane.

FIG. 5 is a screenshot of a solid model created in Zemax, showing the irradiance of example square emitter 20 at exit detector plane 40. The detector plane is made larger than the exit face (in this case 10 unit×10 unit) to ensure that any edge effect rays are correctly recorded. The irradiance covers the center of the portion of detector plane 40. In the case of a GaN material, FIG. 5 illustrates the near field distribution at the GaN exit.

Figure 6:
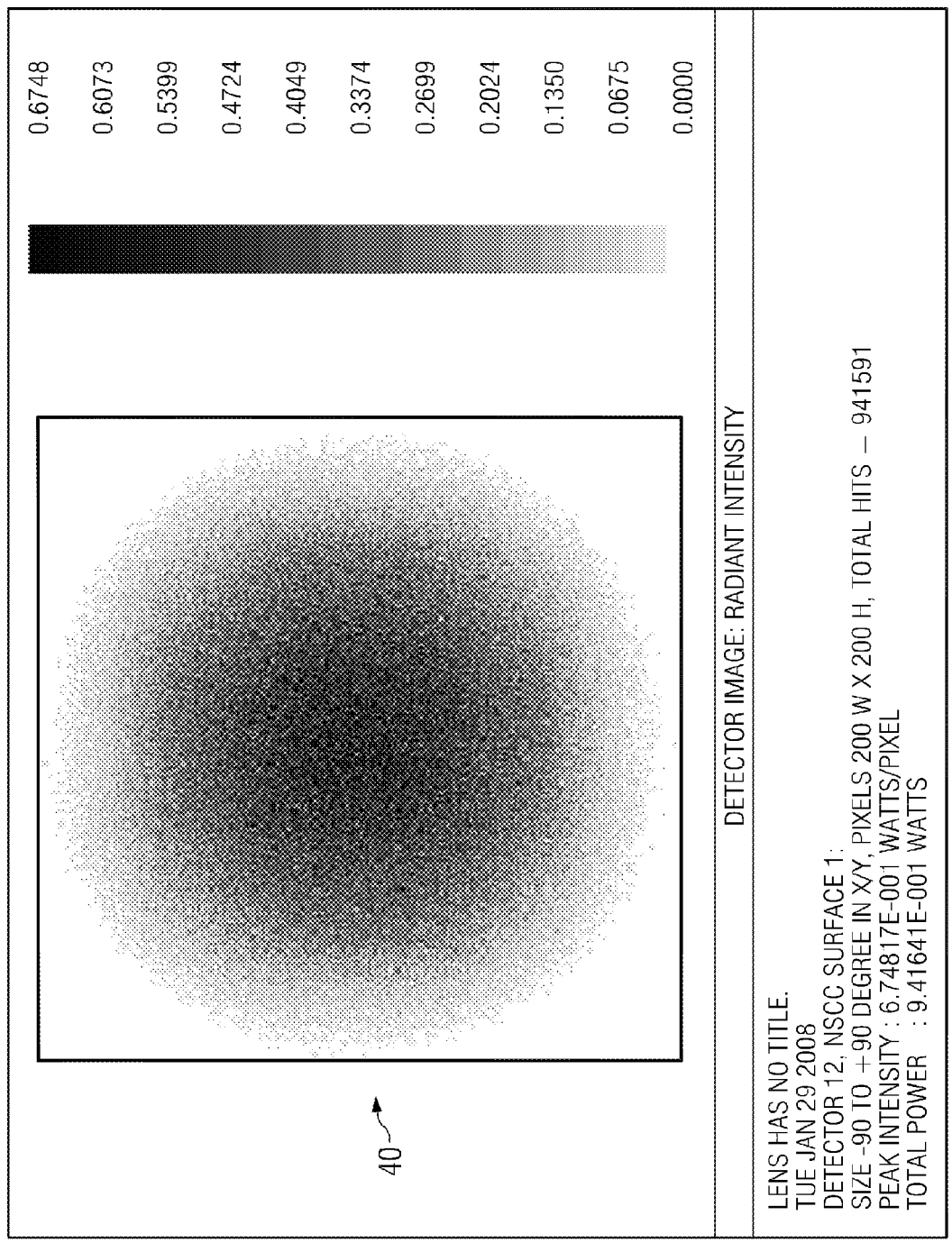
FIG. 6 is a screenshot of the solid model of FIG. 5, showing the far field distribution after the exit detector plane.
Figure 7A:
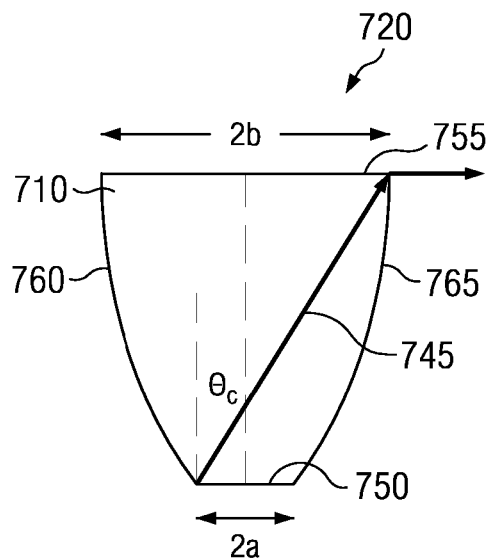
FIGS. 7A-7D show various views of a diagrammatic representation of one embodiment of a hex emitter.
Figure 7B:
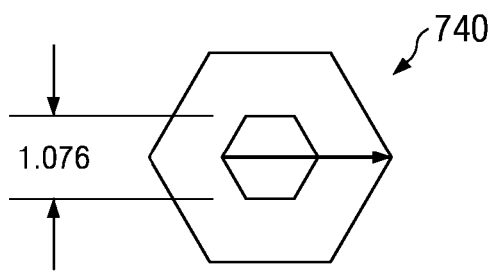
Figure 7C:
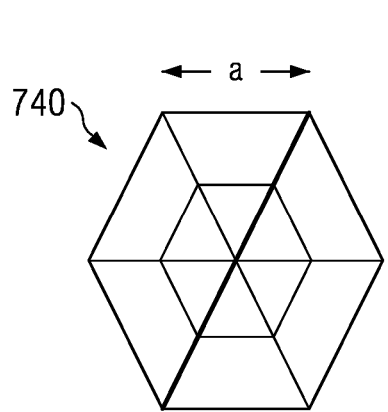
Figure 7D:
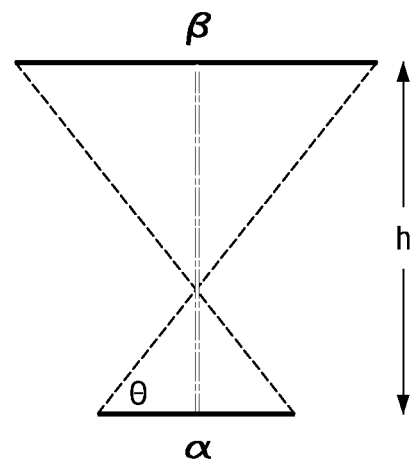

FIG. 6 is another screenshot of the solid model of FIG. 5, showing the radiant intensity at detector plane 40. The radiant intensity at the exit face is equivalent to the irradiance at a far distance and is often called the far field distribution. In the case of a GaN material, FIG. 6 illustrates the far field distribution after GaN.

FIGS. 5 and 6 exemplify the efficiency of an embodiment of a shaped LED at getting light out to air. In this case, approximately 94% of the emitted light is extracted from the emitter layer. This does not take into account absorptive losses within the different material layers and Fresnel losses. Absorptive losses in sapphire are negligible and the GaN layer is very thin. In some embodiments, the GaN layer can be approximately 4-5 micron thick. Fresnel losses are:

$$R_{GaNtoAl2O3} = \left(\frac{n_1 - n_2}{n_1 + n_2}\right)^2 \quad [\text{EQN. 5}]$$

$$= \left(\frac{2.5 - 1.77}{2.5 + 1.77}\right)^2$$

$$= 2.9\%$$

$$T_1 = 1 - R = 97.1\%$$

$$R_{Al2O3toAir} = \left(\frac{n_1 - n_2}{n_1 + n_2}\right)^2$$

-continued $$= \left(\frac{1.77-1}{1.77+1}\right)^2$$

$$= 7.7\%$$

$$T_2 = 1 - R = 92.3\%$$

Efficiency $= T_1 T_2 \varepsilon = 97.1\% \cdot 92.3\% \cdot 94\% \approx 84\%$ The light extracted from the emitter layer when Fresnel losses are taken into account is roughly 84%.

With the addition of anti-reflection coatings at the exit face of the substrate, the sapphire to air Fresnel loss can be eliminated. The total efficiency then will be:

Efficiency$=T_1\varepsilon=97.08\% \cdot 94\% \approx 91\%$ [EQN. 6]

HEX Geometry

Square emitters have the advantage of fitting perfectly together without wasted space. Also, the dicing operation is simplistic with only two orthogonal cuts. Readers are directed to the above-referenced U.S. patent application Ser. Nos. 11/906,219 and 11/906,194, entitled "LED SYSTEM AND METHOD," filed Oct. 1, 2007, for additional teachings on square emitters. It should be noted that the square profile is a rectangular profile with sides of equal length. Although hexagonal emitters are described in the following exemplary embodiments, those skilled in the art will appreciate that the methodologies disclosed herein can apply to various shapes and are not limited by any particular shape, size, configuration, or material.

A hex pattern can fit together without any wasted space. In a shaped device, the hex pattern can offer a lower material volume than a square device. FIGS. 7A-7D show various view of a diagrammatic representation of one embodiment of hex emitter 720.

The area ratio is dictated by the brightness equation and therefore the exit area (755) with respect to the emitter area (750) maintains the 6.25:1 ratio. The height (h), however, would be reduced as follows:

$$A_2 = \frac{n_1^2 \pi}{n_2^2 \pi} A_2 = \frac{n_1^2}{n_2^2} A_1 = \frac{2.5^2}{1^2} A_1 \quad [\text{EQN. 7}]$$

$$A_2 = 6.25 A_1$$

$$k = \frac{3\sqrt{3}}{4}$$

$$A_2 = k\alpha_1^2$$

$$k\alpha_2^2 = 6.25 k\alpha_1^2$$

$$\alpha_2^2 = \sqrt{6.25 \alpha_1^2}$$

$$\alpha_2 = 2.5 \alpha_1$$

$$\beta = 2.5 \alpha$$

$$n_2 \sin(\theta_a) = n_2 \sin\theta_2$$

$$\theta_a = \sin^{-1}\left(\frac{1}{2.5}\right) = 23.57818°$$

$$\theta = 90 - \theta_a = 66.42182°$$

-continued $$\tan(\theta) = \frac{h}{\frac{1}{2}(\alpha+\beta)}$$

$$h = \frac{1}{2}(\alpha+\beta)\tan(\theta) = \frac{1}{2}(\alpha+2.5\alpha)\tan(\theta)$$

$$h = \frac{3.5}{2}\alpha(2.2912878) = 4.01\alpha$$

$$HexArea = \frac{3\sqrt{3}}{2}a^2$$

The height is now 4.01 instead of 5.67 as was with square emitter 20 discussed above [EQN. 4]. The height:side edge:emitter edge ratio in this example is 4.01:2.5:1.

Figure 8:
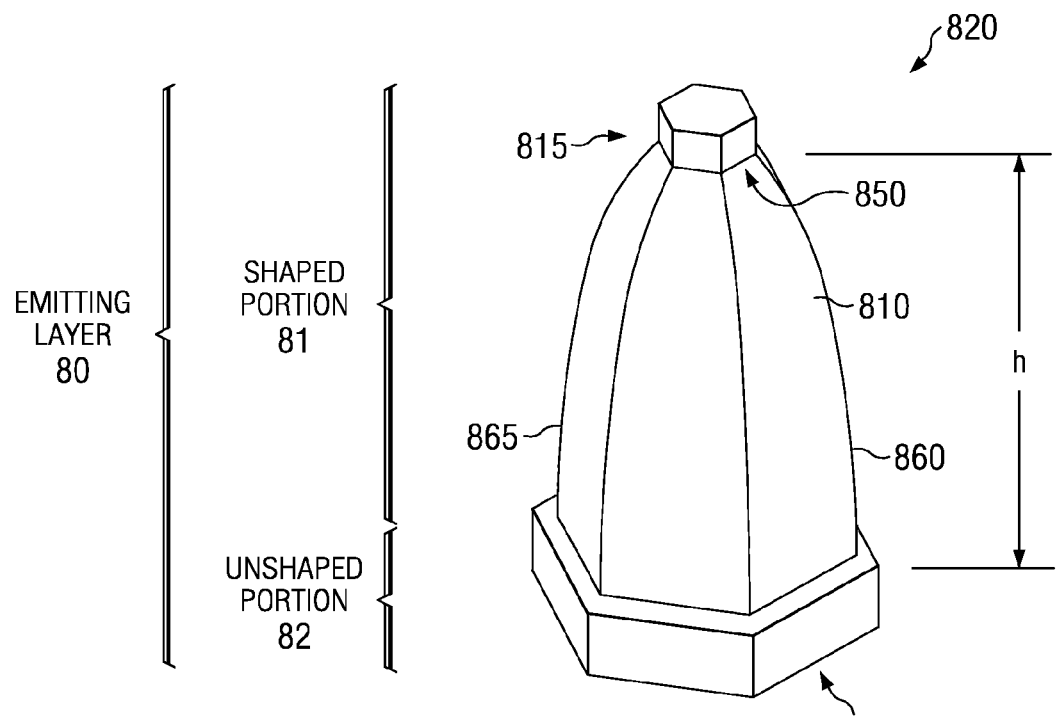
FIG. 8 is a diagrammatic representation of one embodiment of a hex emitter created by shaping an emitter layer of an LED.

Using these base unit dimensions, a solid model can be created and modeled. For example, a solid model can be created in ProE and then modeled in Zemax. FIG. 8 is a diagrammatic representation of one embodiment of hex emitter 820 created by shaping emitter layer 80. In this example, emitter layer 80 comprises shaped portion 81 and unshaped portion 82. In shaped portion 81, GaN layer 810 and sidewalls 860 and 865 are shaped to a controlled height h as described above to maximize light extraction efficiency, allowing photons from quantum well region 815 that enter GaN layer 810 through interface 850 to exit through exit face 855 with minimal energy loss. Readers are directed to the above-referenced U.S. patent application Ser. Nos. 11/906,219 and 11/906,194, entitled "LED SYSTEM AND METHOD," filed Oct. 1, 2007, for additional teachings on the quantum well region.

Figure 9:
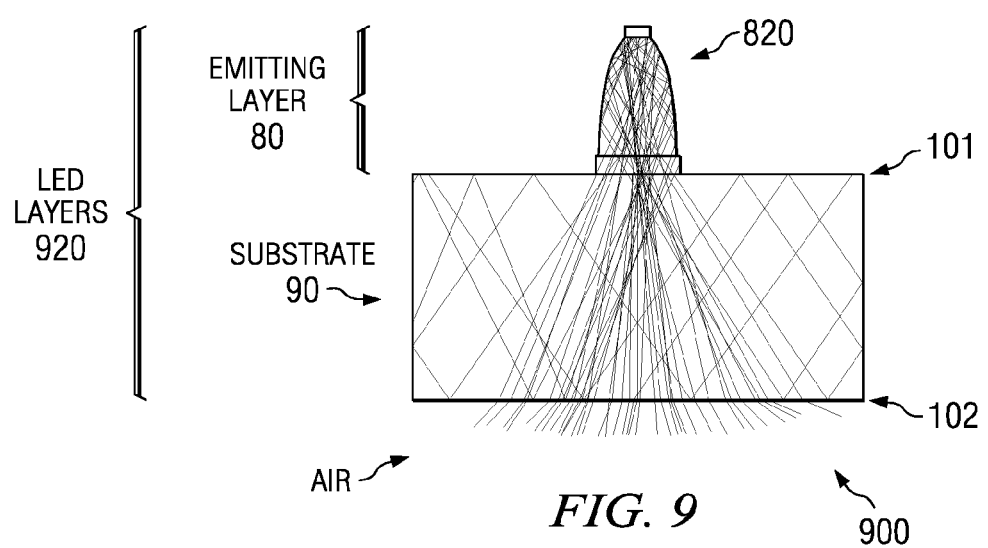
FIG. 9 is a diagrammatic representation of one embodiment of an LED having a plurality of layers, including an emitter layer.

FIG. 9 is a diagrammatic representation of one embodiment of LED 900 having a plurality of layers 920, including emitter layer 80. Light emitted from emitter layer 80 enters substrate 90 through interface 101 and exits substrate 90 into air through interface 102. In one embodiment, substrate 90 is sapphire. The efficiency of hex emitter 820 is approximately 95.5% according to the solid model analyzed in Zemax. That is, approximately 95.5% of the emitted light is extracted from the emitter layer. Taking into account Fresnel losses, the total extraction efficiency is approximately 85%:

$$R_{GaNtoAl2O3} = \left(\frac{n_1-n_2}{n_1+n_2}\right)^2 \quad [\text{EQN. 8}]$$

$$= \left(\frac{2.5-1.77}{2.5+1.77}\right)^2$$

$$= 2.9\%$$

$$T_1 = 1 - R = 97.1\%$$

$$R_{Al2O3toAir} = \left(\frac{n_1-n_2}{n_1+n_2}\right)^2$$

$$= \left(\frac{1-1.77}{1+1.77}\right)^2$$

$$= 7.7\%$$

$$T_2 = 1 - R = 92.3\%$$

Figure 10:
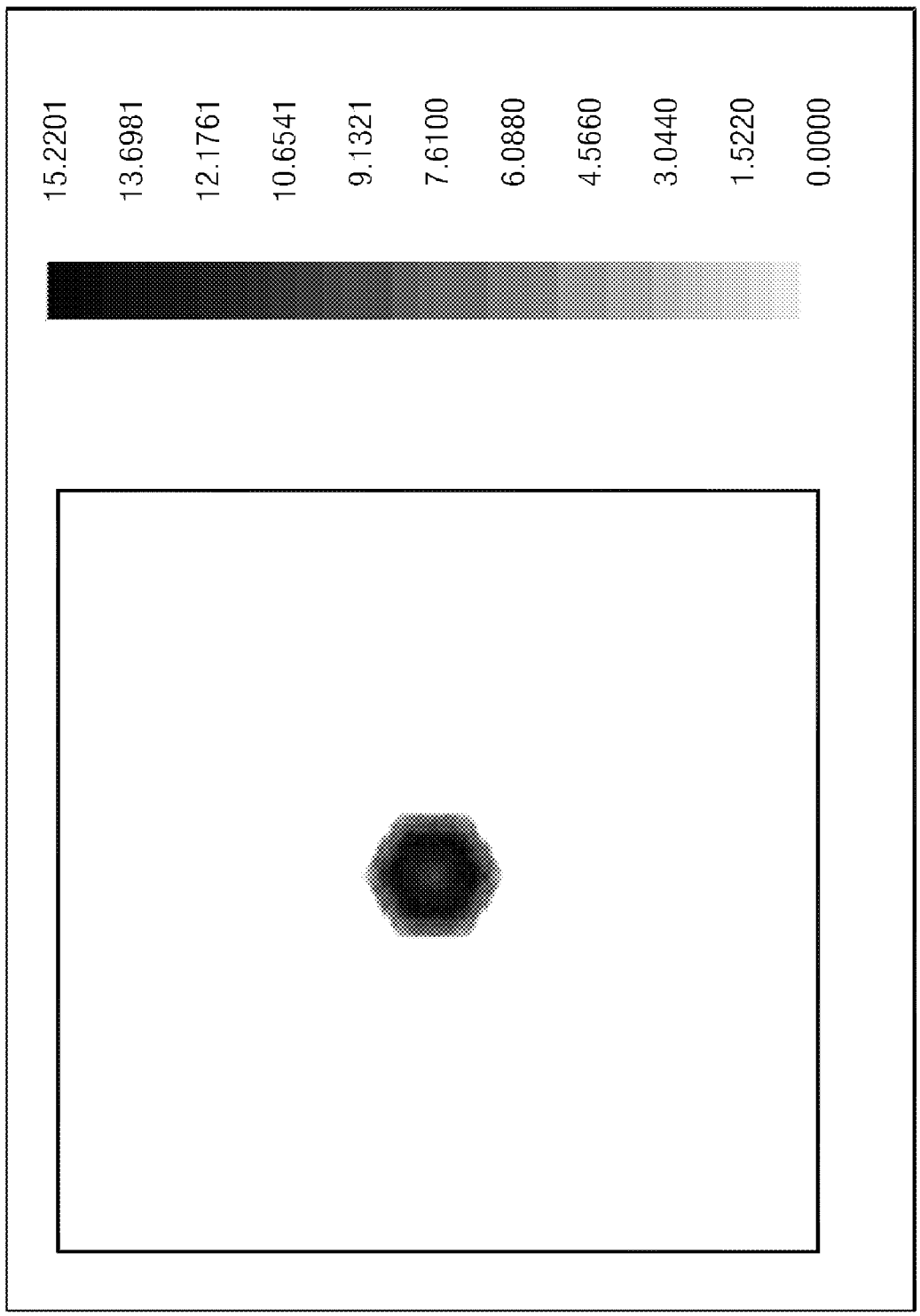
FIGS. 10 and 11 are screenshots of a solid model of a hex emitter, showing the near field and far field distributions.
Figure 11:
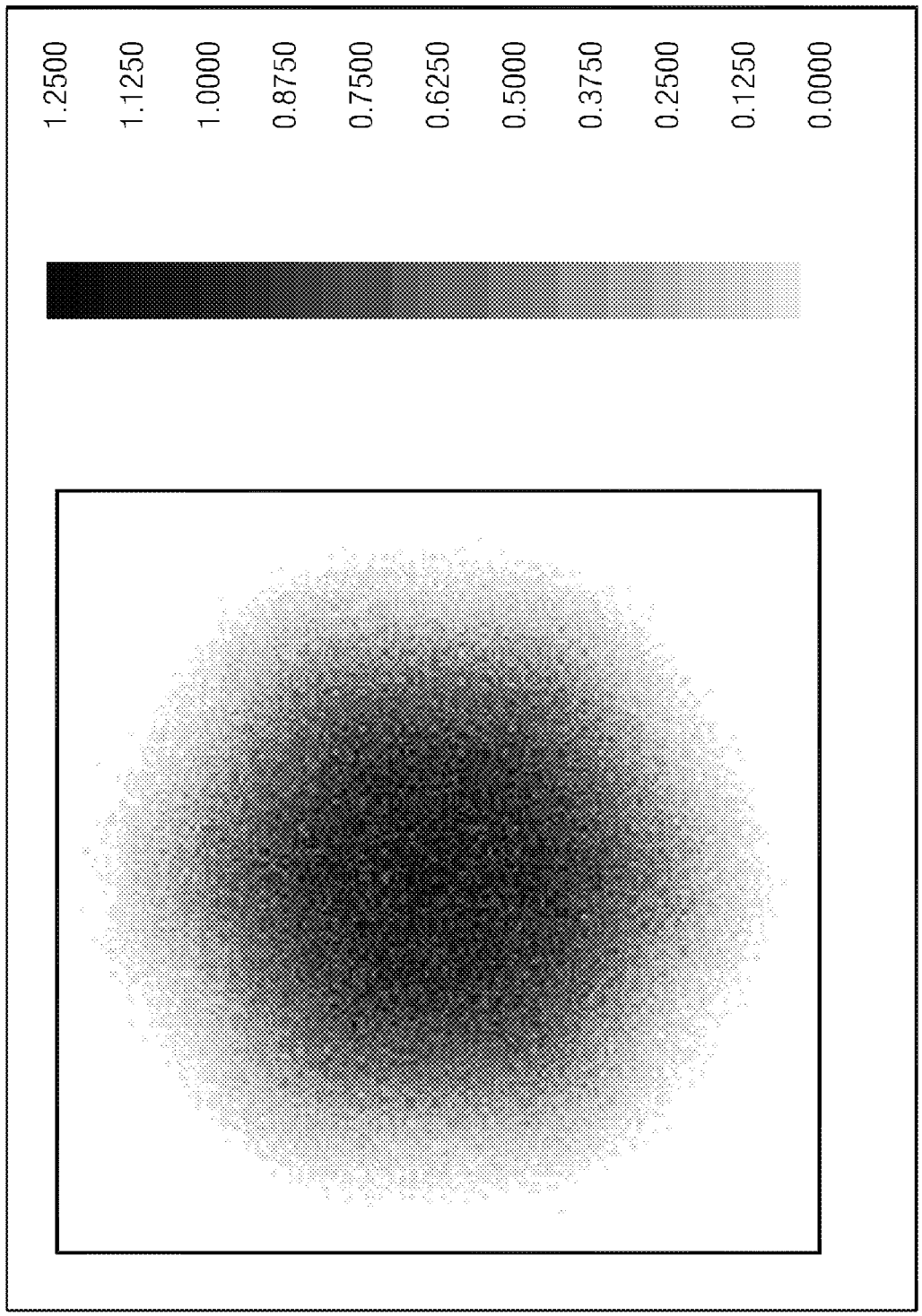

Efficiency $= T_1 T_2 \varepsilon = 97.1\% \cdot 92.3\% \cdot 95.5\% \approx 85\%$ FIG. 10 is a screenshot of a solid model of a hex emitter, showing the near field distribution at the exit surface. FIG. 11 is another screenshot of the solid model of FIG. 10, showing the far field distribution after the exit detector plane. Just as in the case for square shaped devices, anti-reflection coatings can be added at the sapphire to air interface (interface 102) to eliminate the Fresnel losses there. The total extraction efficiency will then be about 92.6%.

Array of Micro Emitters

Figure 12:
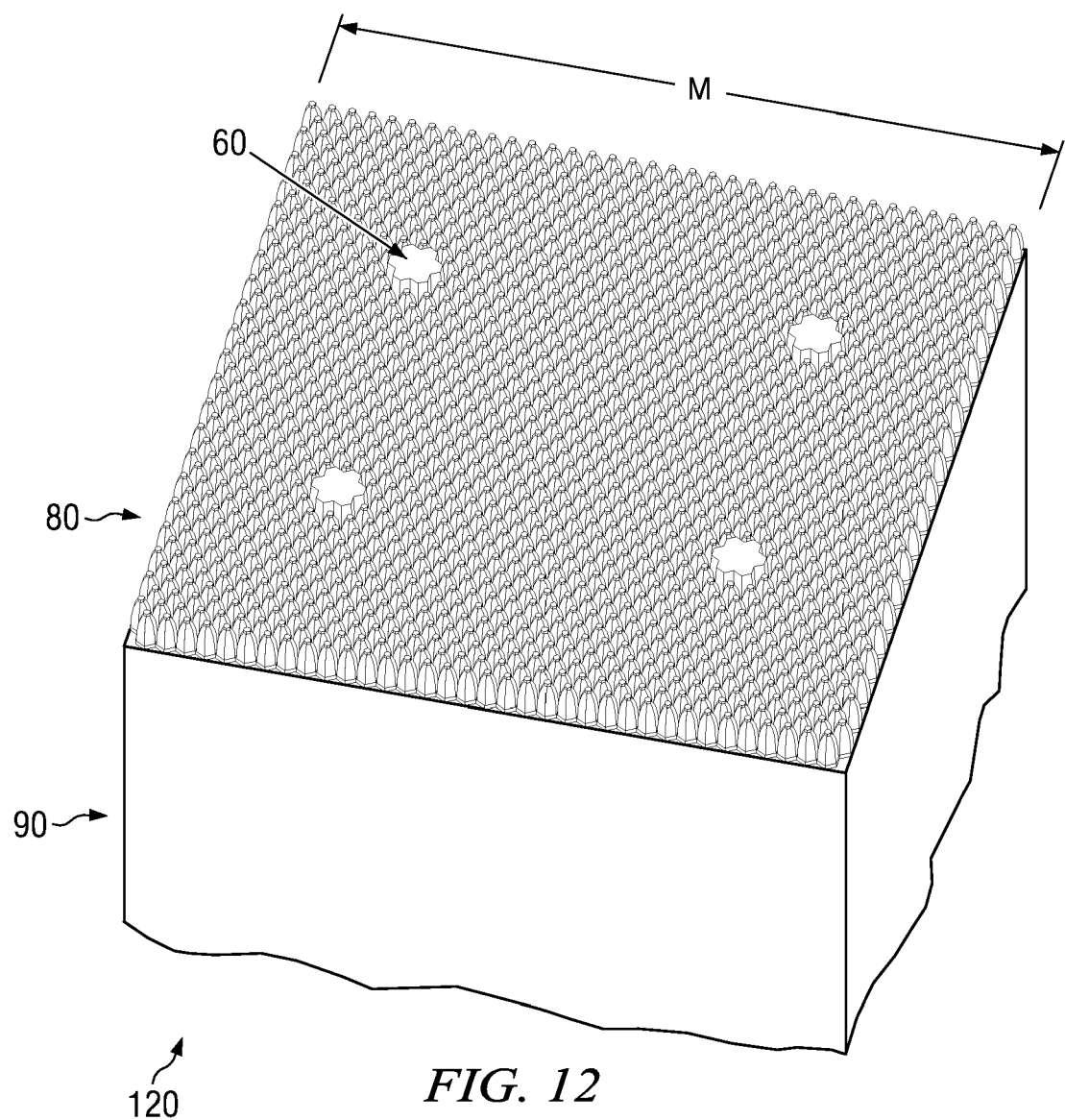
FIG. 12 is a diagrammatic representation of one embodiment of an LED comprising a substrate, an emitter layer, and an N-contact layer.

One advantage of GaN shaping is the ability to shape a large array of emitters to create one LED. Another advantage is that, with tiny emitters, the overall volume that is removed also decreases. FIG. 12 is a diagrammatic representation of one embodiment of LED 120 comprising substrate 90, emitter layer 80, and N-contact layer 60. In one embodiment, substrate 90 is sapphire. In one embodiment, N-contact layer 60 comprises one or more N-contact points. In one embodiment, emitter layer 80 comprises an array of hex shaped micro-LEDs. In one embodiment, emitter layer 80 comprises an M×M array of hex shaped micro-LEDs. In one embodiment, LED 120 is about 100 micron (W)×100 micron (L)×80 micron (D). In the example of FIG. 12, the array of hex shaped micro-LEDs is formed by shaping emitter layer 80. Embodiments of systems and methods disclosed may utilize any substrate and still extract all or generally all of the emitted photons. For purposes of this example, the base substrate is sapphire, but other substrates may be used.

As described above, the shaped portion of the emitter layer gives way to an unshaped portion which is generally in continuous contact with the substrate and which forms an electrical plane or generally continuous electrical connection. The N-contacts are in electrical connection with the unshaped portion of the emitter layers which form an electrical plane, thus allowing for current flow to the shaped portions of the emitter layer through the unshaped portion of the emitter layer. In one embodiment, the N-contact may be a current conducting material such as a metal alloy which may electrically couple the shaped and unshaped portion of the substrate to a power source.

In an alternative embodiment, the unshaped portion of the emitter layer may be coupled to a power source at the edges or one or more shaped portions may be coupled to a power source, or any combination of the above or other method or system of supplying current may be used. The P-contacts, which are smaller and more multitudinous than the N-contacts, may also be coupled to a power source.

The above-described construction has additional advantages for mounting, heat dissipation and uniformity of illumination. The escape angle of each micro-LED, combined with the very small size of each micro-LED is such that the exit rays from one device will overlap the exit rays of a large number of neighboring micro-LEDs while the light is still contained within the thickness of the substrate. By the time the light reaches the exit face of the substrate, the light from many micro-LEDs is averaged, creating a very uniform light output profile. According to some embodiments, the number of micro-LEDs in an emitter layer may range from one to a few, to several thousands, to several millions, or more.

From a thermal standpoint, the emitting base of each micro-LED may be bonded directly to a submount that provides power to the micro-LED and also provides a heat removal path for the micro-LEDs. This inherently provides excellent heat spreading. The heat density is also reduced, because the emitters are spread away from each other.

Likewise, the power to the P layer is supplied at a large number of small points all across the surface of the LED, so the power may be applied to those points by a nearly continuous plane of metalization on the submount. This provides excellent current spreading. Current spreading is a known problem in providing the highest amount of light output from a device. Many configurations are used in the art of different layouts of P and N GaN to achieve improved current spreading. The micro-LED construction inherently provides this spreading.

More specifically, spreading of current in the N layer is achieved by a relatively few contact points into the N layer, because the thickness of the N layer is great compared to the thickness of the P layer. Contacting the N layer, for example, at 4 locations as shown in FIG. 12, is one method of achieving this. Alternately, the N layer could be contacted at a central point or at a number of points around the edge of the array.

Methods of Construction

Etching

Etching describes a chemical process of removing substrate material in a highly controlled manner as to yield the appropriate shape. There are typically two types of etching methods: wet etching and dry etching. Wet etching involves using liquid-phase etchants to remove the substrate material. In dry etching, plasma etching and reactive ion etching, ions are created and imparted onto the substrate. There, either based on chemical reaction or particle momentum, material is removed from the substrate.

Starting with a wafer of substrate material (that may further include material comprising the quantum well region), a particular pattern of photoresist can be deposited on a side of the wafer. The wafer is then etched. Locations on the wafer covered with the photoresist would not be etched, whereas places without the photoresist would have material removed. There are many ways to tune the process to achieve the desired contour at the edge of the photoresist. For example, thicker layers of photoresist can be applied and then sacrificially removed during the etching process, or other sacrificial layers can be used in conjunction with the photoresist. These layers are removed over time by the etchant in such a manner as to produce the desired contour of the LED substrate. This can be exploited to accurately etch the wafer so as to produce shaped substrates. Another way is to use multiple resists and multiple etching steps. Each photoresist and etch step can be used to remove a small layer of material. Multiple small steps can be use get the desired 3D shape.

Etching parameters may be based on the substrate material. The etch rate varies depending on the etchant and the substrate. For substrate materials used in LED applications such as sapphire and silicon carbide, the etch rates using reactive ion etching can range from 250 nm to 2.5 μm per min, which may be slow for commercial production purposes. Silicon carbide is on the upper end of the above etch rate while sapphire is on the lower end.

In some embodiments, the shaping of the GaN sidewalls of InGaN/GaN based epi-structure may be carried out by a multi-step dry etch process in $Cl_2/BCl_3/Ar$ plasma using a toroidal lens template. In some embodiments, this dry etching process of n- and p-GaN and InGaN layers may be carried out by inductively coupled plasmas reactive ion etching (ICP-RIE) using a photoresist and Ni photo-mask. A controlled gas flow rates of $Cl_2/BCl_3/Ar$ can be used in order to maintain a lower etched surface roughness less than 0.5 nm at constant ICP/bias power, i.e., 300/100 W and 4 mTorr chamber pressure. An etching rate of 12,000 Å/min for n-GaN is anticipated at 30 mTorr, 300 W ICP, 100 W bias power using low flow rate ($Cl_2/BCl_3/Ar$) gas mixtures. Care should be used to maintain the lower surface roughness of the GaN sidewalls during the multi-step etch process. As an example, a low root mean square (rms) roughness value of less than 1 nm at 100 W of bias power is to be maintained.

For etching of the taper walls of an InGaN/GaN based structure, a relatively high $Cl_2$ flow rate and low chamber pressure ~4 mTorr is to be kept in order to achieve a smooth mirror-like facet of GaN. ICP power and chamber pressure optimization should be performed carefully, because the taper shape of the etched facets always depends on their selected parameters. Using appropriate etching parameters, as would be understood by those in the art, mirror-like sidewall facets of n-GaN can be obtained, which can be used for the fabrication of InGaN/GaN-based light emitting diodes. Moreover, at the fixed gas flow rate, and at relatively lower ICP/bias power and chamber pressure, the InGaN-based materials taper sidewalls shapes can further be improved and modified.

Figure 13:
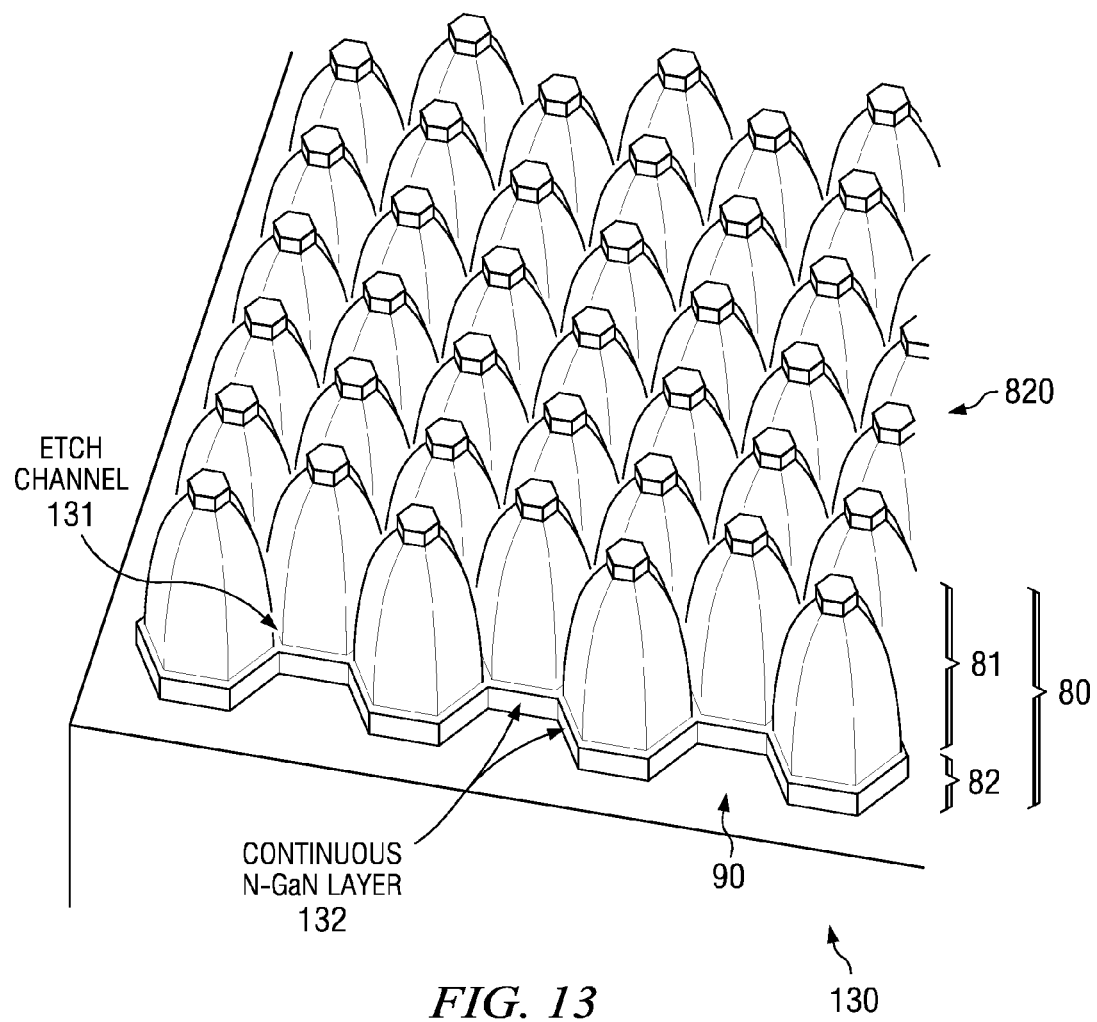
FIG. 13 is a diagrammatic representation of one embodiment of an LED comprising a substrate and an emitter layer having an array of hex emitters formed in a shaped portion of the emitter layer.

FIG. 13 is a diagrammatic representation of one embodiment of LED 130 comprising substrate 90 and emitter layer 80 having an array of hex emitters 820 formed in shaped portion 81 of emitter layer 80. As shown in FIG. 13, a portion or layer of the emitter layer is shaped by removing emitter layer material to form an array of micro-LED emitters which may have shaped sidewalls as shown in FIG. 8 above. More specifically, emitter layer 80 is shaped to a controlled depth or height relative to substrate 90, leaving etch channels 131 between emitters 820 and a generally continuous unshaped layer 82 of emitter layer material 80 abutting substrate 90. In one embodiment, each etch channel 131 is about 0.4 micron wide. That is, in this example, micro-LEDs 820 may be spaced apart by about 0.4 micron at the narrowest point.

In FIG. 13, unshaped portion 82 of emitter layer 80 abutting substrate 90 forms continuous N-GaN layer 132 where the unshaped emitter layer material is generally in continuous contact with the substrate. Thus, in one embodiment, there may be a continuous layer of emitter layer material which is generally in contact with the substrate and which is in electrical contact or which forms an electrical plane or continuous electrical connection. Because, in one or more embodiments, not all or generally not all of the emitter layer material is shaped, there will be a shaped portion of the emitter layer which may be shaped to a controlled depth or height to form sidewalls and an unshaped portion or region of the emitter layer (of the emitter layer material) which is unshaped. In one embodiment, the limiting ray may be selected to generally terminate at the depth or height of the shaped portion of the emitter layer relative to the substrate.

Multi-Step Mesa Etch Process

Figure 14:
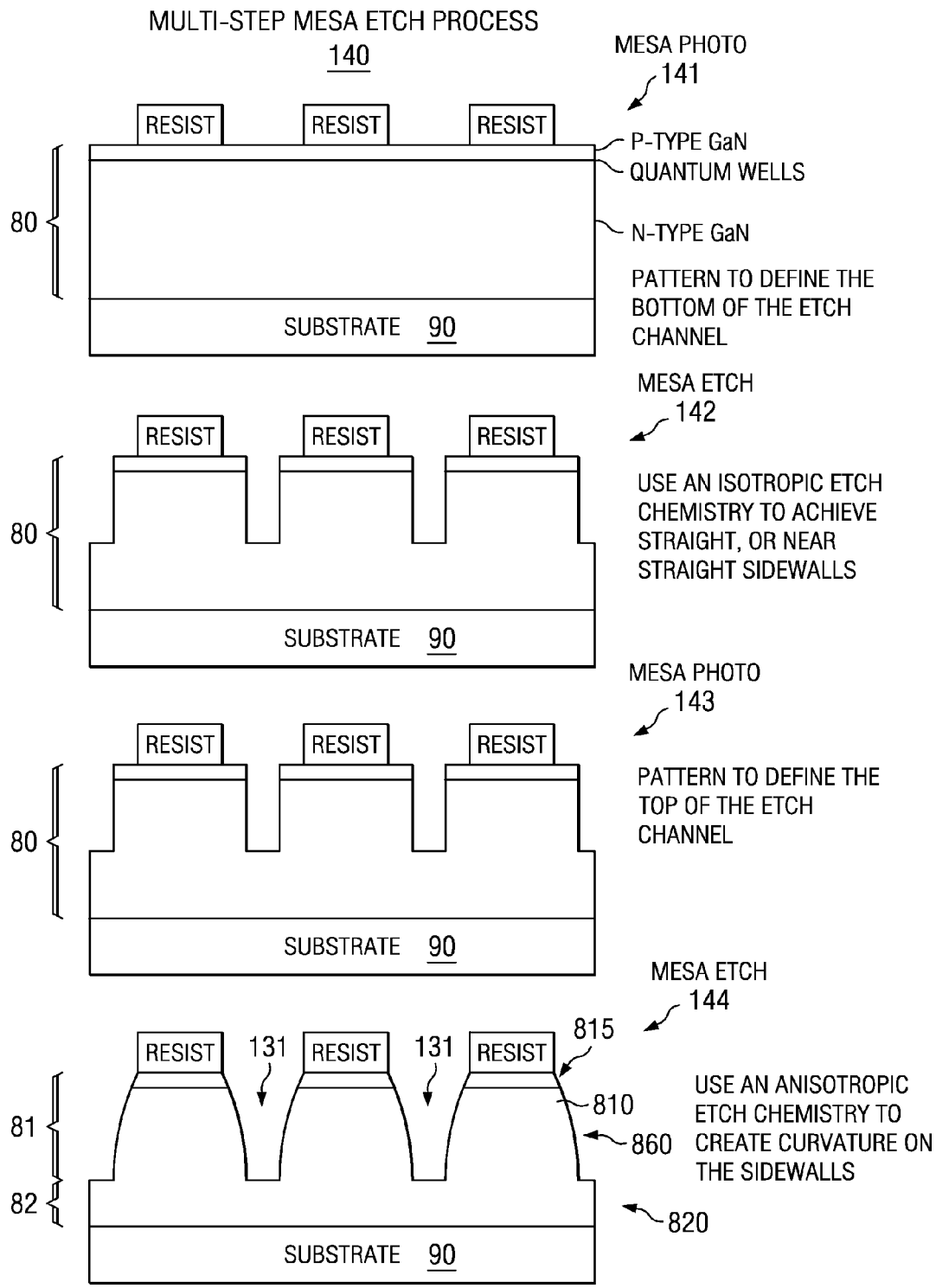
FIG. 14 is a diagrammatic representation of one embodiment of a multi-step mesa etch process.

FIG. 14 is a diagrammatic representation of one embodiment of a multi-step mesa etch process. Within this disclosure, "mesa" refers to a section of a wafer that remains after etching and that forms what appears as a "mesa" and becomes the light emitting portion of the device. At step 141, emitter layer 80 is patterned to define the bottom of etch channels 131. At step 142, an isotropic etch chemical is used to achieve straight, or near straight sidewalls. At step 143, emitter layer 80 is patterned again to define the top of etch channels 131. At step 144, an anisotropic etch chemical is used to create curvature on the sidewalls. In some embodiments, subsequent processing can include metallization and passivation. In various embodiments, multiple photo and etch steps may be used to better refine the final profile of the light emitter layers. The etch chemistries can be chosen to vary the sidewall profile from straight (isotropic) to curved (anisotropic). This can be done through a single step to create a curved shaped or in multiple steps to etch various facets in the light emitter layers sidewall shape. The order of manufacturing steps can be varied as desired. For example, the top of the mesa can be defined first and subsequent photo etch. Steps can etch deeper in the epi structure.

In the example of FIG. 14, one embodiment of LED 140 may be manufactured by the multi-step mesa etch process described above. In this example, LED 140 comprises substrate 90 and emitter layer 80. Emitter layer 80, in this example, comprises shaped portion 81 that is formed by the multi-step mesa etch process described above, leaving unshaped portion 82 of emitter layer 80 abutting substrate 90. The patterning and etching steps of the multi-step mesa etch process create etch channels 131 between emitters 820. As described above with reference to FIG. 8, each emitter 820 may comprise shaped substrate 810 with shaped sidewalls 860 and quantum well region 815. Shaped substrate 810 is of an emitting material. In one embodiment, the emitting material is GaN. In one embodiment, substrate 90 is sapphire.

Other etch processes may also be used to produce LED 140. For example, one embodiment of a method for shaping an emitter layer may comprise, in the following order, depositing p-layer metals onto a substrate, depositing reflective layers on the p-layer metals, depositing $SiO_2$ protective layer (buffer) onto the reflective layers, etching the deposited layers to a desired shape, and then depositing n-layer metals. As another example, one embodiment of a method for shaping an emitter layer may comprise, in the following order, depositing a Mask A pattern, etching away unwanted material according to the Mask A pattern, depositing a Mask B pattern, etching away additional material according to the Mask B pattern, repeating the patterning-etching steps to build up a desired height, the depositing of n-layer metals and p-layer metals. Reflective layer can also be deposited as desired.

Some embodiments may skip the isotropic etch step to attain the straight side walls and move directly to shaping the emitting material which, in one embodiment, comprises GaN. For example, one embodiment of a method for shaping an emitter layer may comprise, in the following order, blanket coating a substrate with p-layer metals, photoresist patterning the substrate coated with the p-layer metals, and etching away unwanted material accordingly. In one embodiment, ICP-RIE is utilized to etch away unwanted material from the emitter layer. Other etching methods may also be used.

This method uses only a single mask GaN profile and the p contact thus created is used as a hard mask, avoiding the need to align back to the mesa and eliminating a photoresist patterning step. By varying the concentrations of dichlorine ($Cl_2$) and boron trichloride ($BCl_3$) gases, different GaN etch slopes may be attained. More specifically, in some embodiments, as the GaN material is being etched, a series of steps is executed to change the ratio of $Cl_2$ and $BCl_3$ concentrations to influence the local slope. For instance, straighter sidewall may be obtained using a greater concentration of $Cl_2$ or $Cl_2$ only. $BCl_3$-rich chemistry produces polymer to passivate the sidewall. To get a particular slope at height=0, the $Cl_2$ and $BCl_3$ plasmas may have a particular concentration ratio. To get another slope at height=1, the concentration ratio of $Cl_2$ and $BCl_3$ may be varied. The above steps may be repeated until a desired height is reached. Over the full height of the emitter layer and depending upon the concentration ratio of the etching plasmas, the slopes of the sidewalls of each micro-LED in the emitter layer may go from very shallow to very steep, thus shaping the emitter layer.

Some embodiments may utilize a single photoresist pattern with two masking materials for profiled GaN etching. For example, one embodiment of a method for shaping an emitter layer may comprise the following features:

1) The photoresist pattern is oversized relative to the final GaN area.
2) The focus/exposure can be utilized to slop sidewalls for further profile control.
3) Use oxide for a hard mask. In one embodiment, a hard mask can be etched in either BOE/HF or can be plasma etched using Sulfur Hexafluoride ($SF_6$) as an example. Buffered Oxide Etch (BOE) is a mixture of ammonium fluoride and hydrofluoric acid (HF) with a more controlled etch rate of silicon oxide.
4) Use resist etch ratio of about 1:1 and oxide etch ratio of about 5:1. The 1:1 etch ratio is used to target resist thickness such that the resist is consumed mid-etch. This reveals previously protected regions of GaN.
5) The oxide hard mask etches at the ratio of about 5:1, making it robust for the remainder of the etch.
6) Controlling the $Cl_2$ and $BCl_3$ ratio can also help with profile control.

Mechanical Shaping

FIG. 14 represents one method of forming an array of micro-LEDs and is illustrative and not limiting: other methods for forming arrays of micro-LEDs are possible and are within the scope of the invention. In some embodiments, a method for creating the shaped GaN materials involves using a laser to ablate the GaN materials to form the desired shapes and provide the smoothness needed. Laser ablation is the process of using a high power laser to produce LEDs by removing or ejecting quantum well region or substrate material. Each laser pulse will only remove a minute amount of material.

The laser can be translated to remove material with each subsequent pulse. By translating in the X-Y and Z directions, a 3D shape can be removed. Embodiments of laser ablation can be used to shape substrates faster than etching. Using known techniques, laser ablation can remove around 500 μm to 1 mm in thickness per minute in silicon carbide and sapphire.

Another method would involve liquid jet cutting, using a particulate in the water or oil jet to cause removal of material. A water jet may be used to ablate a wafer to form a substrate of the desired shape. In one embodiment of water jet ablation, short pulses of water can be used to ablate a wafer in stages. The process by which pulses of water are used to ablate a wafer may be similar to the process described above in regard to laser ablation. In one embodiment of water jet ablation, the water jet can be used to cut completely through the wafer at a certain angle, then the angle shifted slightly and the water jet used to cut through the wafer at a slightly higher angle, eventually producing a substrate of the desired shape. In a further embodiment, the water jet may be charged with abrasive material (e.g., industrial diamond particles) to increase the rate at which material is ablated.

Another option is to mechanically remove material through grinding, milling, sawing, ultrasonic grinding, polishing, drilling, or other systems or methods of mechanical removal. There are numerous methods for removing material to shape one or more LEDs through mechanical removal. While the above methods of ablating a wafer of material to form desired shapes have been described individually, the above methods may be combined. For example, it may be possible to use a combination of mechanical removal and water jet ablation to ensure an appropriately curved sidewall shape. Similarly, various other combinations of methods and techniques for removing substrate material from a wafer can be used as appropriate depending on the substrate material. In one embodiment, the mechanical removal of material may be done in stages.

In embodiments of ultrasonic grinding, a tool with the inverse shape of one or more LEDs is primed with an abrasive and brought into contact with the substrate material while the tool is ultrasonically vibrated to produce a scrubbing/scuffing action on the substrate material such that material is removed and shaped substrates are produced.

Figure 15:
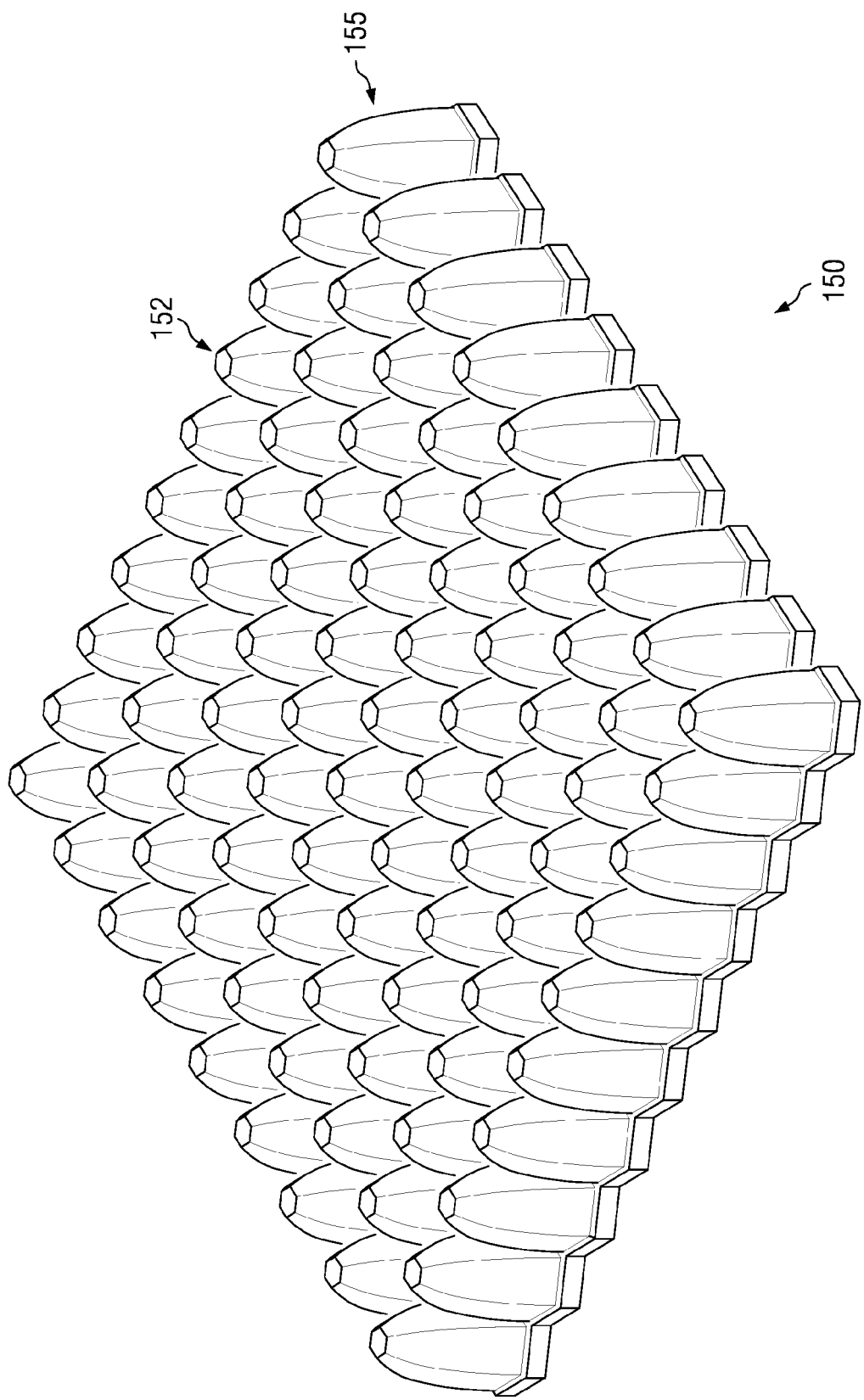
FIG. 15 is a diagrammatic representation of one embodiment of an LED comprising an array of micro-LEDs in hexagonal geometrical configuration with curved sidewalls.
Figure 16:
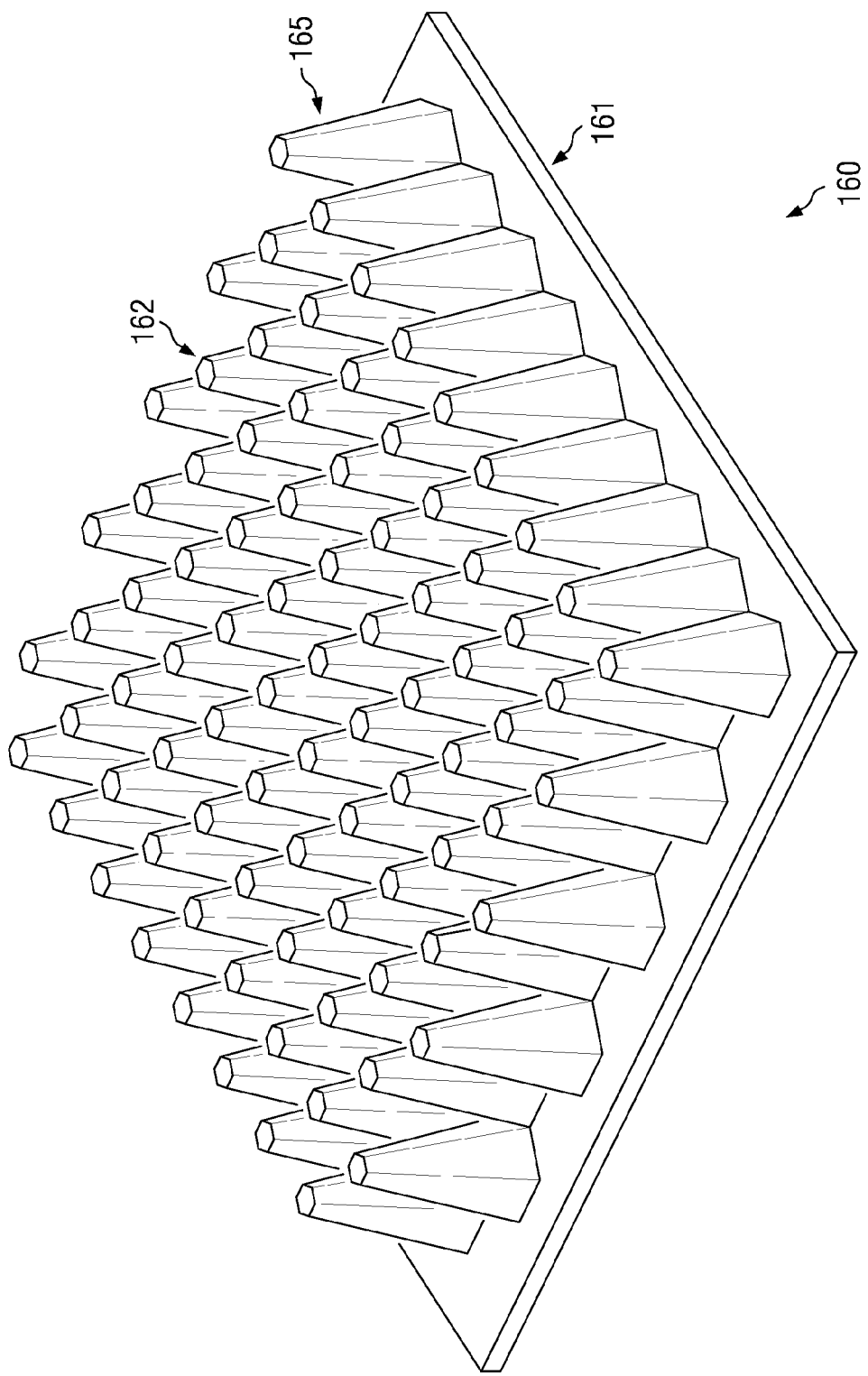
FIG. 16 is a diagrammatic representation of one embodiment of an LED comprising an array of micro-LEDs in hexagonal geometrical configuration with angled sidewalls.

Additional examples of systems and methods for shaping LED substrates and sidewalls are described in the above-referenced U.S. patent application Ser. Nos. 11/906,219 and 11/906,194, entitled "LED SYSTEM AND METHOD," filed Oct. 1, 2007, both of which are fully incorporated herein for all purposes. The various methods of shaping the sidewalls may be applied to the light emitter layers as described above. As an example, FIG. 15 is a diagrammatic representation of one embodiment of LED 150 comprising an array of micro-LEDs 152 in hexagonal geometrical configuration with curved sidewalls 155. LED 150 in this example takes a rectangular shape. However, other shapes are also possible. As another example, FIG. 16 is a diagrammatic representation of one embodiment of LED 160 comprising substrate 161 and an array of micro-LEDs 162 in hexagonal geometrical configuration with angled sidewalls 165. As yet another example, FIG. 17 is a diagrammatic representation of one embodiment of LED 170 comprising substrate 171 and an array of micro-LEDs 172 in hexagonal geometrical configuration with straight sidewalls 175.

Growing

In some embodiments, micro-LEDs may also be made by growing the emitter layer. Take GaN as an example, deposition is one of many commonly used processes to grow GaN thin films. GaN has been grown by many types of epitaxial growth and on several substrates, including SiC and sapphire. Example GaN growth methods include, but are not limited to, metal organic chemical vapor deposition (MOCVD), iodine vapor phase growth (IVPG), molecular beam epitaxy (MBE), mechanical sputter epitaxy, (MSE), and Hydride Vapor Phase Epitaxy (HVPE).

In some embodiments, a method of shaping an emitter layer of an LED may comprise determining an exit area (b) and an emitter area (a) of a micro-LED, also referred to as a miniature emitter, wherein the exit area (b) has an exit face in a first geometric configuration and wherein the emitter area (a) has a quantum well region in a second geometric configuration. Using the exit area (b) and the emitter area (a), a minimum height (h) of the miniature emitter may be calculated as described above. The method may further comprise growing the miniature emitter by deposition according to the first geometric configuration, the second geometric configuration, and the minimum height (h) to form a shaped portion meeting the minimum height (h). One or more micro-LEDs can be produced simultaneously this way. In some cases, an unshaped portion may also be formed. The unshaped portion of the emitter layer abuts a base substrate. Sapphire is one example of a suitable base substrate. In growing the miniature emitter, the sidewalls of the miniature emitter are positioned and shaped to cause at least a majority of rays having a straight transmission path from the emitter area to that sidewall to reflect to the exit face with an angle of incidence at the exit face at less than or equal to a critical angle at the exit face. In some embodiments, micro-LEDs may also be made by growing and shaping the emitter layer using techniques known to those skilled in the art. In some embodiments, the growing and shaping of the emitter layer may occur alternately, simultaneously, or generally at the same time.

Thus, in some embodiments, an LED manufactured by a method of shaping an emitter layer of the LED may comprise an emitter layer on a surface of the base substrate, wherein the emitter layer has a shaped portion, wherein the shaped portion comprises an exit area (b), an emitter area (a), a minimum height (h), and sidewalls, wherein the exit area (b) has an exit face in a first geometric configuration, wherein the emitter area (a) has a quantum well region in a second geometric configuration, wherein the minimum height (h) is determined utilizing the exit area (b) and the emitter area (a), wherein each of the sidewalls is positioned and shaped to cause at least a majority of rays having a straight transmission path from the emitter area to that sidewall to reflect to the exit face with an angle of incidence at the exit face at less than or equal to a critical angle at the exit face.

Applications

LEDs with shaped light emitter layers can be used in a variety of applications. One reason for such versatility is that micro-LEDs can be arranged in various ways to form desired LEDs. The LEDs, each having an array of tiny emitters, can also be arranged to produce a desired amount of light and a desired light pattern. For example, micro-LEDs and/or LEDs may be arranged in a square, a rectangle, a circle, or other shape. Using an array of LEDs to produce the desired amount of light may be more efficient or may consume less space than using a single LED. As FIG. 14 exemplifies, an array of micro-LEDs can be formed from the same wafer in which wafer material is removed to form etch channels 131 and emitters 820. While the above embodiments describe forming micro-LEDs from a wafer of material, shaped substrates utilized to produce LEDs can be formed from a bar of substrate material.

In some cases, it may be desired to generate white light using a LED. This can be accomplished by impinging light from a single-color (e.g., blue), short wavelength LED onto phosphors or other particles that absorb the light and re-emit light in a wavelength that the human eye perceives as white light. Phosphors or other particles can be used with embodiments of LEDs to produce white light.

Coating the exit face or faces of a LED may have fabrication advantages that may allow for the simplification of white light LED fabrication, which may in turn reduce the cost of white light LED fabrication. For example, a side of a wafer out of which shaped substrate LEDs will be formed may be coated with a layer containing phosphors or other particles (i.e. a particle coating) that can be excited to emit white light. The side of the wafer that has not been coated with the particle coating can be ablated. When the wafer has been ablated to produce multiple LEDs, the LEDs will have an exit face having the particle coating necessary to produce white light. Furthermore, because a shaped substrate directs a supermajority of light entering the substrate to a known exit face or faces, coating a particular exit face or faces may be highly effective in the generation of white light. Accordingly, the use of a shaped substrate may eliminate the need to coat the sidewalls or a portion of the sidewalls of an LED with a particle coating. Thus, there will be no need to individually apply a particle coating to each LED. Applying a particle coating to a side of a wafer may be cheaper than applying a particle coating to individual LEDs. The sidewalls of the substrate can be designed so that light scattered back into the substrate by interactions with the particle coating may be partially or fully recycled. Utilizing nano-particles to generate white light in conjunction with a LED allows for minimum deflection of light, thus minimizing backscattered light and maximizing the light emitted from the exit face.

Potential applications for embodiments of LEDs include cell phone display lighting. Present systems typically use three side-emitting blue LEDs with phosphor-filled encapsulant material to generate white light. The sides of the LED are typically opaque and a large percentage of the light generated is absorbed by the sidewalls. This results in over 50% of the light being lost to absorption. In addition, the index change at the interface of the encapsulant to air creates a TIR condition for exit rays striking the interface at greater than the critical angle. This results in approximately 44% loss at the interface. Embodiments of shaped substrate LEDs, can deliver 80% of the generated light to the light guide, resulting in very large system brightness improvements.

Another potential application for embodiments of LEDs is use as a cell phone camera flash. Present systems typically use LEDs with Gaussian energy distributions that produce a very bright area in the center of the image and dark areas at the edges, causing uneven lighting of the subject matter. Moreover, the beam shape of present flash units is circular, while the image captured by the CCD camera is rectangular. Additionally, the index of refraction change at the interface of the encapsulant to air creates a TIR condition for exit rays striking the interface at greater than the critical angle. This results in losses at the interface that are a function of the exit solid angle. Embodiments of LEDs, on the other hand, can deliver a rectangular or square flash, with 80% of the light entering the substrate of the LED being provided to the image area in a uniform distribution. This results in more uniform scene illumination and higher levels of illumination as opposed to prior art LED flash systems.

Another potential application for embodiments of LEDs is for liquid crystal display ("LCD") backlighting. Traditional LCD systems use a linear array of red, green and blue LEDs. The light from the LEDs is directed into a mixing light guide to provide uniformity of color and intensity. Typically, the LEDs have a dome placed over the LED and light is captured by elliptical reflectors to direct the light to the light guide. While elliptical reflectors work well for point sources, LEDs are not point sources and some of the rays will not get to the focii inside the light guide. Moreover, since some light from a dome encapsulant is emitted at greater than 180 degrees, some of the light is absorbed by the substrate, PCB board and other components. Furthermore, because the dome is large with respect to the size of the cavity in the dome, a certain percentage of light typically gets refracted. Because these losses are multiplicative, only a percentage of the light originally emitted from the LED actually gets to the light guide.

Embodiments of LEDs, on the other hand, can provide up to 80% of the light entering the substrate of the LED to the light guide (assuming Fresnel losses) in the desired cone angle. Consequently, lower power LEDs can be used to achieve the same results as are possible in current systems or more light can be delivered at the same power consumption level. Indeed, in some embodiments, the light guide may not be required and arrays of LEDs may be used to directly backlight LCDs.

Another potential use for embodiments of LEDs is in car headlights, flashlights, digital light processing ("DLP") systems and other devices. The shape of the LED can be selected so as to provide the desired projection cone and beam profile. Furthermore, the combination of a LED and a condenser lens or other optical device, such as the Primary Optic Device ("POD") described in U.S. patent application Ser. No. 11/649,018, entitled "SEPARATE OPTICAL DEVICE FOR DIRECTING LIGHT FROM AN LED", allows for the emission of a narrow solid angle (on the order of 0.1 steradians or less) while conserving radiance and doing so in a very small volume. Such a combination is applicable for flashlights, spot lights or any other narrow beam application.

In summary, embodiments of the micro-LED construction disclosed herein can provide improvements over the art in the following areas:
- Current spreading
- Heat removal
- Uniformity of emission
- Increased percentage of active area (P layer) relative to inactive area (N layer) contacts
- Higher external quantum efficiency
- Lower heat generated per lumen due to higher extraction efficiency
- Conserve true brightness Advantages of systems and methods disclosed herein over shaping the entire LED, including the substrate, or shaping the substrate alone include extracting 100% or approximately or generally 100% of the light generated at the emitter layers from the emitter layers. Furthermore, less material is removed and little or none of the substrate material (which may be difficult or costly to remove, such as, for example, in the case of sapphire) need to be removed, which may speed the production of LEDs and reduce the cost of producing LEDs. Moreover, because light emitting layers are already etched in some LED forming processes, etching the light emitting layers according as described herein can greatly increase light extraction efficiency without adding greatly to the time required for manufacture.

Another feature of this design is that phosphors may be added at the exit face of the substrate to change the color of the emitted light. If the micro-LEDs are made to emit blue light for example, and phosphors are added to convert a portion of that light to yellow light, then the sum of the emitted light will appear to be white light.

Due to the inherent design of the micro-LEDs, any light which is reflected back into the substrate from the phosphors will be internally reflected back to the quantum well region of the micro-LEDs. This allows for efficient photon recycling with low losses. If nanoparticle phosphors are used, then there will be no backscatter and maximum efficiency will be obtained.

A further feature of this type of construction is to allow for optically smooth sidewalls of the substrate material. Typically in industry, the individual die are cut apart either by diamond sawing or by scribing and breaking. These methods produce die sidewalls that are optically rough (diffusing surface) or perhaps optically smooth but randomly contoured (scribed and broken surfaces). Commonly in industry, the die separation methods are seen as just that—a way to separate the devices and little attention is given to the quality of those surfaces.

According to various embodiments of LEDs with shaped light emitter layers, the sidewalls may be used as additional TIR surfaces to maintain the direction of the light rays from the micro-LEDs that are near to the edges of the die. In this case, a ray originating from a near-edge micro-LED may strike the sidewall before it reaches the exit face of the substrate. With the sidewall being optically smooth, the ray will internally reflect and be relayed to the exit face of the substrate. This maintains the condition that the rays striking the exit face do so at angles not greater than the critical angle, so they may pass through the exit face.

In one embodiment, the LED die can be separated as is commonly done in industry, or in accordance with general industry practice. Thus, embodiments of systems and methods disclosed herein may be easily integrated into existing processes for LED production, streamlining commercialization and possibly making use of existing equipment and facilities.

In embodiments disclosed above, Fresnel losses may occur at the interface between the emitter layers and the substrate and may occur at the interface between the substrate and air or other medium. Fresnel losses at the interface between the substrate and air or other medium may be reduced by coating the exit face of the substrate with anti-reflective coating.

If desired, the sidewalls of the substrate may be left not optically smooth, or partially smooth, in this case, some portion of the light striking the sidewalls may be allowed to exit through the sidewalls instead of being reflected to the primary exit face. This may have advantage for certain lighting situations.

While this disclosure describes particular embodiments, it should be understood that the embodiments are illustrative and that the scope of the invention is not limited to these embodiments. Many variations, modifications, additions and improvements to the embodiments described above are possible. By way of example, in addition to sapphire and silicon carbide, other substrates that allow the passage of light may be used. For example, substrates may be made of glass, moldable glass, or diamond. It is contemplated that these variations, modifications, additions and improvements fall within the scope of the invention as detailed in the following claims.

What is claimed is:

1. A method of shaping an emitter layer of the LED, comprising:
    determining an exit area (b) and an emitter area (a) of a miniature emitter, wherein the exit area (b) has an exit face in a first geometric configuration and wherein the emitter area (a) has a quantum well region in a second geometric configuration;
    determining a minimum height (h) of the miniature emitter utilizing the exit area (b) and the emitter area (a);
    removing matter from an emitting material or growing the emitting material according to the first geometric configuration, the second geometric configuration, and the minimum height (h) to form a shaped portion having one or more miniature emitters meeting the minimum height (h); and
    shaping sidewalls of the miniature emitters, wherein each sidewall is positioned and shaped to cause at least a majority of rays having a straight transmission path from the emitter area to that sidewall to reflect to the exit face with an angle of incidence at the exit face at less than or equal to a critical angle at the exit face.

2. The method according to claim 1, wherein removing matter from the emitting material further comprises:
    patterning the emitting material using a first mask having the first geometric configuration;
    etching the emitting material according to the minimum height (h) and the first geometric configuration;
    patterning the emitting material using a second mask having the second geometric configuration; and
    etching the emitting material according to the second geometric configuration.

3. The method according to claim 2, wherein the first mask defines a minimum width of etch channels in the emitter layer and wherein the one or more miniature emitters comprise an array of miniature emitters that are spaced apart by the minimum width of the etch channels.

4. The method according to claim 1, wherein the emitting material comprises gallium nitride (GaN).

5. The method according to claim 1, wherein removing matter from an emitting material or growing the emitting material by deposition according to the first geometric configuration, the second geometric configuration, and the minimum height (h) further forms an unshaped portion abutting a base substrate.

6. The method according to claim 5, wherein the base substrate comprises aluminum oxide ($Al_2O_3$) or silicon carbide (SiC).

7. The method according to claim 5, further comprising applying an anti-reflection coating on a surface of the base substrate, wherein the surface interfaces with air.

8. The method according to claim 1, wherein the first geometric configuration has four or six sides.

9. The method according to claim 1, wherein determining the minimum height (h) of the miniature emitter further comprises determining one or more limiting rays traversing a longest distance or approximately a longest distance from the emitter area (a) to the exit area (b) of the miniature emitter.

10. An LED manufactured by a method of shaping an emitter layer of the LED, the method comprising:
   determining an exit area (b) and an emitter area (a) of a miniature emitter, wherein the exit area (b) has an exit face in a first geometric configuration and wherein the emitter area (a) has a quantum well region in a second geometric configuration;
   determining a minimum height (h) of the miniature emitter utilizing the exit area (b) and the emitter area (a);
   removing matter from an emitting material or growing the emitting material according to the first geometric configuration, the second geometric configuration, and the minimum height (h) to form a shaped portion having one or more miniature emitters meeting the minimum height (h); and
   shaping sidewalls of the miniature emitters, wherein each sidewall is positioned and shaped to cause at least a majority of rays having a straight transmission path from the emitter area to that sidewall to reflect to the exit face with an angle of incidence at the exit face at less than or equal to a critical angle at the exit face.

11. The LED of claim 10, wherein the emitter material comprises gallium nitride (GaN).

12. The LED of claim 10, wherein removing matter from an emitting material or growing the emitting material by deposition according to the first geometric configuration, the second geometric configuration, and the minimum height (h) further forms an unshaped portion abutting a base substrate.

13. The LED of claim 12, wherein the base substrate comprises aluminum oxide ($Al_2O_3$) or silicon carbide (SiC).

14. The LED of claim 12, wherein the method further comprises applying an anti-reflection coating on a surface of the base substrate, wherein the surface interfaces with air.

15. The LED of claim 10, wherein removing matter from the emitting material further comprises:
   patterning the emitting layer using a first mask having the first geometric configuration;
   etching the emitting layer according to the minimum height (h) and the first geometric configuration;
   patterning the emitting layer using a second mask having the second geometric configuration; and
   etching the emitting material according to the second geometric configuration.

16. The LED of claim 15, wherein the first mask defines a minimum width of etch channels in the emitter layer and wherein the one or more miniature emitters comprise an array of miniature emitters that are spaced apart by the minimum width of the etch channels.

17. The LED of claim 10, wherein the first geometric configuration has four or six sides.

18. The LED of claim 10, wherein determining the minimum height (h) of the miniature emitter further comprises determining one or more limiting rays traversing a longest distance or approximately a longest distance from the emitter area (a) to the exit area (b) of the miniature emitter.

* * * * *